United States Patent
Minami et al.

(10) Patent No.: US 10,030,172 B2
(45) Date of Patent: Jul. 24, 2018

(54) ABRASIVE, ABRASIVE SET, AND METHOD FOR POLISHING SUBSTRATE

(71) Applicant: HITACHI CHEMICAL COMPANY, LTD., Tokyo (JP)

(72) Inventors: Hisataka Minami, Tokyo (JP); Tomohiro Iwano, Tokyo (JP); Toshiaki Akutsu, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 15/108,001

(22) PCT Filed: Sep. 10, 2014

(86) PCT No.: PCT/JP2014/073980
§ 371 (c)(1),
(2) Date: Jun. 24, 2016

(87) PCT Pub. No.: WO2015/098197
PCT Pub. Date: Jul. 2, 2015

(65) Prior Publication Data
US 2016/0319159 A1    Nov. 3, 2016

(30) Foreign Application Priority Data

Dec. 26, 2013 (JP) .................. 2013-268956

(51) Int. Cl.
| | | |
|---|---|---|
| *C09G 1/02* | (2006.01) | |
| *B24B 37/04* | (2012.01) | |
| *C09K 3/14* | (2006.01) | |
| *H01L 21/3105* | (2006.01) | |

(52) U.S. Cl.
CPC .............. *C09G 1/02* (2013.01); *B24B 37/044* (2013.01); *C09K 3/1409* (2013.01); *C09K 3/1472* (2013.01); *H01L 21/31053* (2013.01)

(58) Field of Classification Search
CPC ...... C09G 1/02; B24B 37/044; C09K 3/1409; C09K 3/1472; H01L 21/31053
See application file for complete search history.

(56) References Cited

U.S. PATENT DOCUMENTS

2013/0252426 A1*  9/2013  Hoshi ................... B24B 37/044
                                                    438/692

FOREIGN PATENT DOCUMENTS

| | | | |
|---|---|---|---|
| JP | 2001-294848 A | 10/2001 | |
| JP | 2008-091411 A | 4/2008 | |
| JP | 2010-141288 A | 6/2010 | |
| JP | 2012-084906 A | 4/2012 | |
| JP | 2013-138153 A | 7/2013 | |
| JP | 2014-207281 A | 10/2014 | |
| KR | 2012 077190 A * | 7/2012 | |
| TW | 201000613 A1 | 1/2010 | |
| WO | 02/067309 A1 | 8/2002 | |
| WO | 2009/131133 A1 | 10/2009 | |
| WO | WO 2009131133 A1 * | 10/2009 | .......... B24B 37/044 |
| WO | 2012/070541 A1 | 5/2012 | |
| WO | 2012/070542 A1 | 5/2012 | |
| WO | 2012/070544 A1 | 5/2012 | |
| WO | 2013/125441 A1 | 8/2013 | |
| WO | 2013/125446 A1 | 8/2013 | |
| WO | 2014/034358 A1 | 3/2014 | |

OTHER PUBLICATIONS

International Search Report of WO Appln. No. PCT/JP2014/073980 dated Dec. 22, 2014 in English.
International Preliminary Report of WO Appln. No. PCT/JP2014/073980 dated Jul. 7, 2016 in English.
Notice of Allowance dated Nov. 7, 2017, in Japanese Patent Application No. P2015-554602.

* cited by examiner

*Primary Examiner* — Anita K Alanko
(74) *Attorney, Agent, or Firm* — Fitch, Even, Tabin & Flannery, L.L.P.

(57) ABSTRACT

A polishing agent comprises: a fluid medium; an abrasive grain containing a hydroxide of a tetravalent metal element; a first additive; a second additive; and a third additive, wherein: the first additive is at least one selected from the group consisting of a compound having a polyoxyalkylene chain and a vinyl alcohol polymer; the second additive is a cationic polymer; and the third additive is an amino group-containing sulfonic acid compound.

8 Claims, 2 Drawing Sheets

ABRASIVE, ABRASIVE SET, AND METHOD FOR POLISHING SUBSTRATE

TECHNICAL FIELD

The present invention relates to a polishing agent, a polishing agent set, and a method for polishing a base. In particular, the invention relates to a polishing agent, a polishing agent set, and a method for polishing a base, used in manufacturing steps of semiconductor elements.

BACKGROUND ART

As manufacturing techniques of VLSI semiconductor elements, processing techniques for densification and miniaturization of the semiconductor elements have been presently researched and developed. CMP (Chemical Mechanical Polishing) technique is one of the processing techniques like this. A flattening technique using CMP has become an essential technique for flattening interlayer insulating materials, forming STI (Shallow Trench Isolation), forming plugs, forming embedded metal wires (damascene step), or the like, in manufacturing steps of semiconductor elements. A CMP step (flattening step using a CMP technique) is generally performed by supplying a CMP polishing agent between a polishing pad (polishing cloth) and a material to be polished of a base and by polishing the material to be polished with the polishing pad.

Various polishing agents have been known as the CMP polishing agent used for CMP. When the CMP polishing agent is classified according to the kinds of abrasive grains (polishing particles), there have been known a ceria-based polishing agent comprising cerium oxide (ceria) particles, a silica-based polishing agent comprising silicon oxide (silica) particles, an alumina-based polishing agent comprising aluminum oxide (alumina) particles, a resin particle-based polishing agent comprising organic resin particles, or the like.

Incidentally, in recent years, achievement of further miniaturization of wires has been required in manufacturing steps of semiconductor elements, and polishing scratches generated during polishing have become a problem. More specifically, when polishing is performed using conventional polishing agents, generation of fine polishing scratches gives no problem as long as the size of the polishing scratches is smaller than the conventional wire width, but becomes a problem in the case where further miniaturization of wires is tried to be achieved.

For this problem, the average particle diameter of the abrasive grains comprised in the polishing agent is tried to be reduced. However, if the average particle diameter is reduced, the polishing rate is decreased due to a decrease in the mechanical action. It is extremely difficult to achieve both a polishing rate and polishing scratches in this manner. In response to this, polishing agents using abrasive grains including a hydroxide of a tetravalent metal element have been studied (for example, refer to the following Patent Literatures 1 to 4).

In CMP steps or the like for formation of STIs, polishing is performed for a laminated product including a substrate having an irregularity pattern, a stopper (polishing stop layer) disposed on the convex part of the substrate, and an insulating material (for example, silicon oxide) disposed on the substrate and the stopper so as to fill the concave part of the substrate. The polishing of the insulating material is stopped by the stopper during such a polishing. More specifically, the polishing of the insulating material is stopped at the stage where the stopper is exposed. This is because it is difficult to artificially control the polished amount of the insulating material (for example, the removed film thickness in the insulating film), and the polishing degree is controlled by polishing the insulating material until the stopper is exposed. In this case, it is necessary to increase polishing selectivity for insulating material with respect to stopper material (polishing rate ratio: polishing rate for insulating material/polishing rate for stopper material).

In response to the demand, a polishing agent comprising an additive has been known (for example, refer to the following Patent Literature 5). According to this technique, there is described polishing of silicon oxide using silicon nitride as a stopper material by a polishing agent comprising particles of a hydroxide of a tetravalent metal element and at least one of a cationic polymer and polysaccharide.

Silicon nitride is conventionally used as a stopper material, but polysilicon is increasingly used as the stopper material in recent years. In this case, it is necessary to further increase polishing selectivity for insulating material with respect to polysilicon. In response to the demand, a polishing agent comprising an additive has been known (for example, refer to the following Patent Literature 6).

CITATION LIST

Patent Literature

Patent Literature 1: International Publication No. WO2002/067309
Patent Literature 2: International Publication No. WO2012/070541
Patent Literature 3: International Publication No. WO2012/070542
Patent Literature 4: International Publication No. WO2012/070544
Patent Literature 5: International Publication No. WO2009/131133
Patent Literature 6: International Publication No. WO2013/125446

Non Patent Literature

Non Patent Literature 1: Complete Works of Dispersion Technology, Johokiko Co., Ltd., July, 2005, Chapter 3, "Dispersers: Recent development trends and selection criteria"

SUMMARY OF INVENTION

Technical Problem

Incidentally, in CMP steps or the like for formation of STIs, after polishing insulating materials such as silicon oxide and stopping the polishing at the stage where the stopper has been exposed, there is a case where extra polishing is performed even after exposure of the stopper in order to avoid residue of the insulating material on the stopper. Such extra polishing is referred to as "overpolishing".

When overpolishing is performed simply using a polishing agent with high polishing selectivity for insulating material with respect to stopper material, the insulating material other than the insulating material located on the stopper is also excessively polished. This promotes dishing (a phenomenon in which depressions (step heights) are produced in the insulating material serving as a device isolation layer) or the like, and can result in inferior flatness after polishing. In CMP steps or the like for formation of STIs, therefore, it is often necessary not only to increase the polishing selectivity for insulating material with respect to stopper material, but also to suppress excess polishing of the insulating material other than the insulating material located on the stopper, when the stopper has been exposed.

It is an object of the present invention to solve these problems, and provide a polishing agent, a polishing agent set, and a method for polishing a base, which can obtain excellent polishing selectivity for insulating material with respect to stopper material, and can achieve a high degree of flattening of the surface of a base after polishing, in a CMP technique for polishing an insulating material using a stopper.

Solution to Problem

A polishing agent of the present invention comprises: a fluid medium; an abrasive grain containing a hydroxide of a tetravalent metal element; a first additive; a second additive; and a third additive, wherein: the first additive is at least one selected from the group consisting of a compound having a polyoxyalkylene chain and a vinyl alcohol polymer; the second additive is a cationic polymer; and the third additive is an amino group-containing sulfonic acid compound.

According to the polishing agent of the present invention, it is possible to suppress excessive increase in the polishing rate for stopper material and improve the polishing rate for insulating material, compared to a conventional polishing agent, to obtain excellent polishing selectivity for insulating material with respect to stopper material. According to the polishing agent of the present invention, compared to a conventional polishing agent, it is also possible to reduce dishing after polishing to achieve a high degree of flattening of the surface of a base after polishing. Furthermore, according to the polishing agent of the present invention, it is possible to polish the insulating material with few polishing scratches, while achieving a high degree of flattening of the surface of the base after polishing.

The second additive is preferably at least one selected from the group consisting of an allylamine polymer, a diallylamine polymer, a vinylamine polymer and an ethyleneimine polymer. Thereby, it is possible to obtain more excellent polishing selectivity for insulating material with respect to stopper material.

The third additive may be at least one selected from the group consisting of sulfamic acid, an aliphatic aminosulfonic acid, an aromatic aminosulfonic acid and their salts. Thereby, it is possible to further improve flatness.

A content of the third additive is preferably 0.0005 mass % or more and 0.2 mass % or less based on a total mass of the polishing agent. Thereby, it is possible to further improve the polishing rate for insulating material and to further improve flatness.

The hydroxide of a tetravalent metal element preferably contains an anion (excluding a hydroxide ion) bonded to the tetravalent metal element. Thereby, it is possible to further improve the polishing rate for insulating material.

One aspect of the present invention relates to use of the polishing agent for polishing of a surface to be polished containing silicon oxide. More specifically, the polishing agent of the present invention is preferably used for polishing of a surface to be polished containing silicon oxide.

A polishing agent set of the present invention comprises constituent components of the polishing agent stored as separate liquids containing a first liquid and a second liquid, wherein the first liquid contains the abrasive grain, and the second liquid contains at least one selected from the group consisting of the first additive, the second additive and the third additive. According to the polishing agent set of the present invention, it is possible to obtain the same effect as that of the polishing agent of the present invention.

A first aspect of a method for polishing a base of the present invention comprises a step of polishing a surface to be polished of a base using the polishing agent. According to this method for polishing a base, it is possible to obtain the same effect as that of the polishing agent of the present invention by using the polishing agent.

A second aspect of a method for polishing a base of the present invention comprises a step of polishing a surface to be polished of a base using a polishing agent obtained by mixing at least the first liquid and the second liquid of the polishing agent set. According to this method for polishing a base, it is possible to obtain the same effect as that of the polishing agent of the present invention by using the polishing agent set.

A third aspect of a method for polishing a base of the present invention is a method for polishing a base having an insulating material and a stopper material, and comprises a step of selectively polishing the insulating material with respect to the stopper material using the polishing agent. According to this method for polishing a base, it is possible to obtain the same effect as that of the polishing agent of the present invention by using the polishing agent.

A fourth aspect of a method for polishing a base of the present invention is a method for polishing a base having an insulating material and a stopper material, and comprises a step of selectively polishing the insulating material with respect to the stopper material using a polishing agent obtained by mixing the first liquid and the second liquid of the polishing agent set. According to this method for polishing a base, it is possible to obtain the same effect as that of the polishing agent of the present invention by using the polishing agent set.

In the method for polishing a base of the present invention, the stopper material is preferably polysilicon. According to the method for polishing a base of the present invention, it is possible to obtain the same effect as that of the polishing agent of the present invention even if polysilicon is used as the stopper material.

Advantageous Effects of Invention

According to the present invention, in a CMP technique for polishing an insulating material (STI insulating material, pre-metal insulating material, interlayer insulating material or the like) using a stopper, it is possible to obtain excellent polishing selectivity for insulating material with respect to stopper material, and to achieve a high degree of flattening of the surface of a base after polishing. According to the present invention, it is also possible to polish the insulating material with few polishing scratches, while achieving a high degree of flattening of the surface of the base after polishing.

DESCRIPTION OF EMBODIMENTS

Figure 1:
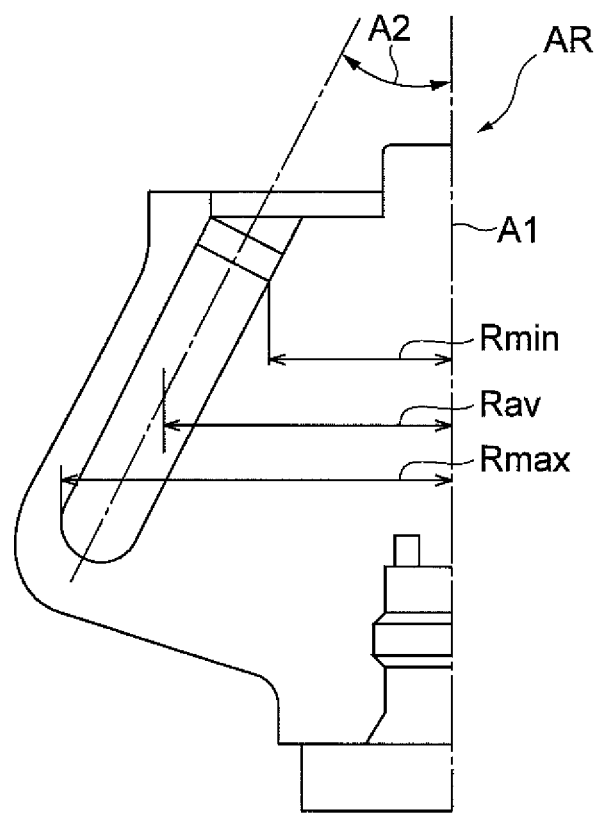
FIG. 1 is a schematic cross-sectional view showing an example of an angle rotor.

Hereinafter, a polishing agent, a polishing agent set, and a method for polishing a base using the polishing agent or the polishing agent set, which are embodiments of the present invention, will be described in detail.

<Polishing Agent and Polishing Agent Set>

A polishing agent of the present embodiment is a composition which contacts a surface to be polished during polishing, and it is a CMP polishing agent, for example. Specifically, the polishing agent of the present embodiment comprises: a fluid medium; an abrasive grain containing a hydroxide of a tetravalent metal element; a first additive; a second additive; and a third additive, wherein: the first additive is at least one selected from the group consisting of a compound having a polyoxyalkylene chain and a vinyl alcohol polymer; the second additive is a cationic polymer; and the third additive is an amino group-containing sulfonic acid compound. Hereinafter, essential components and optionally added components or the like will be described.

(Abrasive Grains)

The polishing agent of the present embodiment comprises abrasive grains including a hydroxide of a tetravalent metal element. The term "hydroxide of a tetravalent metal element" refers to a compound containing a tetravalent metal ion ($M^{4+}$) and at least one hydroxide ion ($OH^-$). The hydroxide of a tetravalent metal element may contain an anion other than a hydroxide ion (for example, a nitrate ion $NO_3^-$ and a sulfate ion $SO_4^{2-}$). For example, the hydroxide of a tetravalent metal element preferably contains an anion (excluding a hydroxide ion, for example, a nitrate ion $NO_3^-$ and a sulfate ion $SO_4^{2-}$) bonded to a tetravalent metal element, and more preferably contains a nitrate ion $NO_3^-$ bonded to the tetravalent metal element.

The hydroxide of a tetravalent metal element is preferably at least one selected from the group consisting of a hydroxide of a rare earth element and a hydroxide of zirconium from the viewpoint of suppressing generation of polishing scratches on a surface to be polished while further improving polishing selectivity for an insulating material with respect to a stopper material. From the viewpoint of further improving the polishing rate for insulating material, the tetravalent metal element is preferably rare earth elements. Examples of rare earth elements which can be tetravalent include lanthanoids such as cerium, praseodymium and terbium, and from the viewpoint of easy availability and further excelling in a polishing rate, cerium is further preferable. A hydroxide of a rare earth element and a hydroxide of zirconium may be used together, or two or more kinds may be selected from rare earth elements.

The polishing agent of the present embodiment may further comprise other kinds of abrasive grains within a range not impairing properties of the abrasive grains including the hydroxide of a tetravalent metal element. Specific examples thereof include abrasive grains including silica, alumina, zirconia, an organic resin or the like.

The lower limit of the content of the hydroxide of a tetravalent metal element in the abrasive grains is preferably 50 mass % or more, more preferably 60 mass % or more, further preferably 70 mass % or more, particularly preferably 80 mass % or more, and extremely preferably 90 mass % or more, based on the total mass of the abrasive grains. It is preferable that the abrasive grains are made of the hydroxide of a tetravalent metal element (substantial 100 mass % of the abrasive grains is particles of the hydroxide of a tetravalent metal element) from the viewpoint of easy preparation of the polishing agent and further excelling in polishing properties, and it is more preferable that the abrasive grains are made of the hydroxide of tetravalent cerium (substantial 100 mass % of the abrasive grains is particles of the hydroxide of tetravalent cerium) from the viewpoint of high chemical activity and further excelling in a polishing rate.

In the constituent components of the polishing agent of the present embodiment, the hydroxide of a tetravalent metal element is thought to have a significant impact on polishing properties. Thus, by adjusting the content of the hydroxide of a tetravalent metal element, a chemical interaction between the abrasive grains and a surface to be polished is improved, and the polishing rate can be further improved. More specifically, the lower limit of the content of the hydroxide of a tetravalent metal element is preferably 0.005 mass % or more, more preferably 0.01 mass % or more, further preferably 0.03 mass % or more, and particularly preferably 0.05 mass % or more, based on the total mass of the polishing agent, from the viewpoint of making it easier to sufficiently exhibit the function of the hydroxide of a tetravalent metal element. The upper limit of the content of the hydroxide of a tetravalent metal element is preferably 20 mass % or less, more preferably 10 mass % or less, further preferably 5 mass % or less, particularly preferably 3 mass % or less, extremely preferably 1 mass % or less, very preferably 0.5 mass % or less, and still further preferably 0.3 mass % or less, based on the total mass of the polishing agent, from the viewpoint of making it easier to avoid aggregation of the abrasive grains, and from the viewpoint of obtaining a favorable chemical interaction with the surface to be polished, and effectively using properties of the abrasive grains.

In the polishing agent of the present embodiment, from the viewpoint of making it easier to obtain a desired polishing rate, the lower limit of the content of the abrasive grains is preferably 0.005 mass % or more, more preferably 0.01 mass % or more, further preferably 0.02 mass % or more, particularly preferably 0.03 mass % or more, and extremely preferably 0.04 mass % or more, based on the total mass of the polishing agent. The upper limit of the content of the abrasive grains is not particularly limited, but from the viewpoint of making it easier to avoid aggregation of the abrasive grains and allowing the abrasive grains to effectively act on the surface to be polished to smoothly promote polishing, it is preferably 20 mass % or less, more preferably 10 mass % or less, further preferably 5 mass % or less, particularly preferably 3 mass % or less, extremely preferably 1 mass % or less, very preferably 0.5 mass % or less, and still further preferably 0.3 mass % or less, based on the total mass of the polishing agent.

In the case where the average particle diameter (average secondary particle diameter) of the abrasive grains is to some extent small, the specific surface area of the abrasive grains which contact the surface to be polished is increased, and thus, the polishing rate can be further improved, and the mechanical action is suppressed, and thus, polishing scratches can be further reduced. Therefore, the upper limit of the average particle diameter is preferably 300 nm or less, more preferably 200 nm or less, further preferably 150 nm or less, particularly preferably 100 nm or less, extremely preferably 80 nm or less, very preferably 60 nm or less, and still further preferably 40 nm or less, from the viewpoint of obtaining a further excellent polishing rate for insulating material and further reducing polishing scratches. The lower limit of the average particle diameter is preferably 1 nm or more, more preferably 2 nm or more, and further preferably 3 nm or more, from the viewpoint of obtaining a further excellent polishing rate for insulating material and further reducing polishing scratches.

The average particle diameter of the abrasive grains can be measured by the photon correlation method. Specifically, the average particle diameter can be measured using, for example, device name: Zetasizer 3000HS manufactured by Malvern Instruments Ltd., device name: N5 manufactured by Beckman Coulter, Inc. or the like. A measuring method using N5 can be performed as follows. Specifically, for example, an aqueous dispersion having a content of the abrasive grains adjusted to 0.2 mass % is prepared, approximately 1 mL (L represents "liter", the same shall apply hereafter) of this aqueous dispersion is poured into a 1-cm square cell, and the cell is placed in the device. A value obtainable by performing measurement at 25° C. with a refractive index and a viscosity of a dispersion medium set to 1.333 and 0.887 mPa·s can be used as the average particle diameter of the abrasive grains.

[Content of Non-Volatile Component]

The abrasive grains are thought to comprise large particles with particle sizes which can be measured with a particle size distribution meter, and fine particles with particle sizes which cannot be measured with a particle size distribution meter. When an aqueous dispersion comprising such abrasive grains dispersed in water has been centrifuged by the action of sufficient centrifugal force, the aqueous dispersion is thought to undergo solid-liquid separation mainly into a solid phase (precipitate) and a liquid phase (supernatant liquid), with the large particles settling as the solid phase and the fine particles floating up into the liquid phase.

The present inventors have found that materials to be polished can be polished at more excellent polishing rates by using abrasive grains which can produce a liquid phase with a high content of non-volatile component when an aqueous dispersion comprising a sufficient amount of the abrasive grains has been centrifuged under specific conditions (conditions which allow action of centrifugal force which can adequately separate the large particles and fine particles). More specifically, the abrasive grains of the present embodiment preferably produce a liquid phase with a content of non-volatile component of 500 ppm or more when an aqueous dispersion having a content of the abrasive grains adjusted to 1.0 mass % has been centrifuged for 50 min ("min" represents "minute") at a centrifugal acceleration of $1.59 \times 10^5$ G.

The present inventors conjecture the following as the reason for which an improving effect on polishing rate is obtained when the content of non-volatile component contained in the centrifuged liquid phase is high. In the case where the slurry and polishing agent comprising the abrasive grains are centrifuged for 50 min at a centrifugal acceleration of $1.59 \times 10^5$ G, substantially all abrasive grains generally settle. However, since the particle diameter is sufficiently small in the present embodiment, many fine particles which do not settle are contained even if centrifuge separation is performed under the conditions above. More specifically, it is thought that an increased content of non-volatile component increases the proportion of fine particles in the abrasive grains, and enlarges the surface area of the abrasive grains contacting the surface to be polished. It is thought that this promotes polishing by chemical action, and improves the polishing rate.

From the viewpoint of obtaining a further excellent polishing rate, the lower limit of the content of non-volatile component of the liquid phase is preferably 500 ppm or more, more preferably 700 ppm or more, and further preferably 800 ppm or more. The upper limit of the content of non-volatile component of the liquid phase is the total amount of the content of the abrasive grains, for example, 10000 ppm.

The apparatus used for the centrifugal separation may be an angle rotor having a tube positioned at a prescribed angle, and a swing rotor having a variable tube angle, with the tube positioned horizontally or nearly horizontally during the centrifugal separation.

FIG. 1 is a schematic cross-sectional view showing an example of an angle rotor. The angle rotor AR has bilateral symmetry around a rotation axis A1 as the center, and only one side (the left side of the figure) is shown in FIG. 1 while the other side (the right side of the figure) is omitted. In FIG. 1, A2 is the tube angle, $R_{min}$ is the minimum radius from the rotation axis A1 to the tube, and $R_{max}$ is the maximum radius from the rotation axis A1 to the tube. $R_{av}$ is the average radius from the rotation axis A1 to the tube, and is calculated as "$(R_{min}+R_{max})/2$".

For this type of centrifugal separation apparatus, the centrifugal acceleration [units: G] can be calculated by the following formula.

$$\text{Centrifugal acceleration } [G]=1118 \times R \times N^2 \times 10^{-8} \quad (1)$$

[In the formula, R represents the radius of rotation (cm), and N represents the rotational speed per 1 min (rpm=$\text{min}^{-1}$).]

In the present embodiment, centrifugal separation is performed with the rotational speed N set for a centrifugal acceleration of $1.59 \times 10^5$ G using the value of the average radius $R_{av}$ in FIG. 1 as the radius of rotation R in formula (1). When a swing rotor is used instead of an angle rotor shown in FIG. 1, the minimum radius $R_{min}$, maximum radius $R_{max}$ and average radius $R_{av}$ are each calculated from the state of the tube in the centrifugal separation, to set the conditions.

For example, the abrasive grains may be separated into large particles and fine particles using an ultracentrifuge 70P-72 manufactured by Hitachi Koki Co., Ltd. as the angle rotor. Specifically, centrifugal separation of the aqueous dispersion can be performed using 70P-72 in the following manner, for example. First, an aqueous dispersion having a content of the abrasive grains adjusted to 1.0 mass % is prepared, and after filling a centrifuge tube (tube) with this, the centrifuge tube is placed in a rotor. After rotating for 50 min at a rotational speed of 50000 $\text{min}^{-1}$, the centrifuge tube is removed from the rotor and the liquid phase in the centrifuge tube is collected. The content of non-volatile component of the liquid phase can be calculated by measuring the mass of the collected liquid phase and the mass of the residue after drying the liquid phase.

[Light Transmittance]

The polishing agent of the present embodiment preferably has high transparency for visible light (visually transparent or nearly transparent). Specifically, the abrasive grains comprised in the polishing agent of the present embodiment preferably produce light transmittance of 50%/cm or more for light having a wavelength of 500 nm in an aqueous dispersion having a content of the abrasive grains adjusted to 1.0 mass %. This makes it possible to further suppress a reduction in the polishing rate due to the addition of an additive, and thus, it makes it easier to obtain other properties while maintaining the polishing rate. From the same viewpoint, the lower limit of the light transmittance is more preferably 60%/cm or more, further preferably 70%/cm or more, particularly preferably 80%/cm or more, extremely preferably 90%/cm or more, very preferably 95%/cm or more, still further preferably 98%/cm or more, and further preferably 99%/cm or more. The upper limit of the light transmittance is 100%/cm.

The reason why the reduction in the polishing rate can be suppressed by adjusting the light transmittance of the abrasive grains in this manner is not understood in detail, but the present inventors conjecture as follows. The action of the abrasive grains including the hydroxide of a tetravalent metal element (for example, cerium), as abrasive grains, is thought to more dominantly depend on the chemical action than on the mechanical action. Therefore, the number of the abrasive grains is thought to contribute to the polishing rate more than the size of the abrasive grains.

In the case where the light transmittance is low in an aqueous dispersion having a content of the abrasive grains adjusted to 1.0 mass %, it is thought that, in the abrasive grains present in the aqueous dispersion, particles having a large particle diameter (hereinafter, referred to as "coarse particles") exist in relatively large numbers. When an additive is added to a polishing agent comprising such abrasive grains, other particles aggregate around the coarse particles as nuclei. It is thought that, as a result, the number of the abrasive grains which act on a surface to be polished per unit area (effective abrasive grain number) is reduced and the specific surface area of the abrasive grains which contact the surface to be polished is reduced, and thus, the polishing rate reduces.

On the other hand, in the case where the light transmittance is high in an aqueous dispersion having a content of the abrasive grains adjusted to 1.0 mass %, it is thought that the abrasive grains present in the aqueous dispersion are in a state where the above-described "coarse particles" are small in number. In the case where the abundance of the coarse particles is low in this manner, even when an additive is added to a polishing agent, the coarse particles which are to be nuclei for aggregation are small in number. For this reason, aggregation between abrasive grains is suppressed or the size of aggregated particles is relatively small. It is thought that, as a result, the number of the abrasive grains which act on a surface to be polished per unit area (effective abrasive grain number) is maintained and the specific surface area of the abrasive grains which contact the surface to be polished is maintained, and thus, the reduction in the polishing rate becomes difficult to occur.

According to the study by the present inventors, it was found that, even among polishing agents in which particle diameters of abrasive grains measured by a common particle diameter measuring device are the same, some may be visually transparent (high light transmittance) and some may be visually turbid (low light transmittance). Accordingly, it is thought that the coarse particles which can produce the action described above contribute to the reduction in the polishing rate even by a very slight amount which cannot be detected by a common particle diameter measuring device.

The above-described light transmittance is transmittance for light having a wavelength of 500 nm. The above-described light transmittance is measured by a spectrophotometer, and specifically, is measured by a spectrophotometer U3310 (device name) manufactured by Hitachi, Ltd., for example.

As a more specific measuring method, an aqueous dispersion having a content of the abrasive grains adjusted to 1.0 mass % is prepared as a measuring sample. Approximately 4 mL of this measuring sample is poured into a 1-cm square cell, and the cell is placed in the device and measurement is performed. In the case where the light transmittance is 50%/cm or more in an aqueous dispersion having a content of the abrasive grains of more than 1.0 mass %, it is clear that the light transmittance is also 50%/cm or more in the case where it is diluted to 1.0 mass %. Therefore, the light transmittance can be screened by a simple method by using an aqueous dispersion having a content of the abrasive grains of more than 1.0 mass %.

[Absorbance]

In the case where the abrasive grains including a hydroxide of a tetravalent metal element produce absorbance of 1.00 or more for light having a wavelength of 400 nm in an aqueous dispersion having a content of the abrasive grains adjusted to 1.0 mass %, the polishing rate can be further improved. The reason for this is not necessarily clear, but the present inventors conjecture as follows. More specifically, it is thought that, depending on manufacturing conditions of the hydroxide of a tetravalent metal element or the like, particles having a composition formula represented by $M(OH)_aX_b$ (in the formula, a+b×c=4) composed of one tetravalent metal ion ($M^{4+}$), 1 to 3 hydroxide ions ($OH^-$) and 1 to 3 anions ($X^{c-}$) are generated as a part of the abrasive grains (it is to be noted that the foregoing particles are also "the abrasive grains including the hydroxide of a tetravalent metal element"). It is thought that, in $M(OH)_aX_b$, the electron-withdrawing anions ($X^{c-}$) act to improve the reactivity of the hydroxide ions and the polishing rate is improved as the abundance of $M(OH)_aX_b$ is increased. It is thought that, since the particles having a composition formula represented by $M(OH)_aX_b$ absorb light having a wavelength of 400 nm, the polishing rate is improved as the abundance of $M(OH)_aX_b$ is increased and the absorbance for light having a wavelength of 400 nm is increased. The abrasive grains including the hydroxide of a tetravalent metal element may be a dinuclear compound or a dinuclear complex as represented by $M_d(OH)_aX_b$ (in the formula, a+b×c=4d), for example. Hereinafter, description will be made by using $M(OH)_aX_b$ as an example.

It is thought that the abrasive grains including the hydroxide of a tetravalent metal element may include not only particles having a composition formula represented by $M(OH)_aX_b$ but also particles having composition formulae represented by $M(OH)_4$, $MO_2$ or the like. Examples of the anions ($X^{c-}$) include $NO_3^-$ and $SO_4^{2-}$.

It is to be noted that the inclusion of the composition formula $M(OH)_aX_b$ in the abrasive grains can be confirmed, after washing the abrasive grains with pure water well, by a method for detecting a peak corresponding to the anions ($X^{c-}$) using the FT-IR ATR method (Fourier transform InfraRed Spectrometer Attenuated Total Reflection Method). The existence of the anions ($X^{c-}$) can also be confirmed by the XPS method (X-ray Photoelectron Spectroscopy). The existence or non-existence of the bond of M and anions ($X^{c-}$) can also be confirmed by conducting EXAFS analysis from X-ray absorption fine structure (XAFS) measurement.

The absorption peak of $M(OH)_aX_b$ (for example, $M(OH)_3X$) at a wavelength of 400 nm has been confirmed to be much smaller than the absorption peak at a wavelength of 290 nm described below. In this regard, the present inventors studied the magnitude of absorbance using an aqueous dispersion having an abrasive grain content of 1.0 mass %, which has a relatively high abrasive grain content and whose absorbance is easily detected to a greater degree, and as a result, found that a polishing rate improving effect is excellent in the case of using abrasive grains which produce absorbance of 1.00 or more for light having a wavelength of 400 nm in such aqueous dispersion. Since the absorbance for light having a wavelength of 400 nm is thought to be derived from the abrasive grains as described above, the above-described polishing rate improving effect cannot be obtained with a polishing agent comprising a substance which produces absorbance of 1.00 or more for light having a wavelength of 400 nm (for example, a pigment component which exhibits a yellow color) in place of the abrasive grains which produce absorbance of 1.00 or more for light having a wavelength of 400 nm.

The lower limit of the absorbance for light having a wavelength of 400 nm is preferably 1.00 or more, more preferably 1.20 or more, further preferably 1.40 or more, and particularly preferably 1.45 or more from the viewpoint of obtaining a further excellent polishing rate.

In the case where the abrasive grains including the hydroxide of a tetravalent metal element produce absorbance of 1.000 or more for light having a wavelength of 290 nm in an aqueous dispersion having a content of the abrasive grains adjusted to 0.0065 mass %, the polishing rate can be further improved. The reason for this is not necessarily clear, but the present inventors conjecture as follows. More specifically, particles having a composition formula represented by $M(OH)_a X_b$ (for example, $M(OH)_3 X$), which are generated depending on manufacturing conditions of the hydroxide of a tetravalent metal element or the like, have a calculated absorption peak at a wavelength of about 290 nm, and for example, particles composed of $Ce^{4+}(OH^-)_3 NO_3^-$ have an absorption peak at a wavelength of 290 nm. Thus, it is thought that, as the abundance of $M(OH)_a X_b$ is increased and the absorbance for light having a wavelength of 290 nm is increased, the polishing rate is improved.

The absorbance for light having a wavelength of about 290 nm tends to be detected to a greater degree as the measuring limit is exceeded. In this regard, the present inventors studied the magnitude of absorbance using an aqueous dispersion having an abrasive grain content of 0.0065 mass %, which has a relatively low abrasive grain content and whose absorbance is easily detected to a small degree, and as a result, found that a polishing rate improving effect is excellent in the case of using abrasive grains which produce absorbance of 1.000 or more for light having a wavelength of 290 nm in such aqueous dispersion. Moreover, the present inventors found that, as absorbance of abrasive grains for light having a wavelength of about 290 nm becomes high, yellowishness of a polishing agent and slurry using such abrasive grains becomes deep, and found that the polishing rate is improved as the yellowishness of the polishing agent and slurry becomes deep. The present inventors found that the absorbance for light having a wavelength of 290 nm in an aqueous dispersion having an abrasive grain content of 0.0065 mass % is correlated with the absorbance for light having a wavelength of 400 nm in an aqueous dispersion having an abrasive grain content of 1.0 mass %.

The lower limit of the absorbance for light having a wavelength of 290 nm is preferably 1.000 or more, more preferably 1.050 or more, further preferably 1.100 or more, particularly preferably 1.150 or more, and extremely preferably 1.200 or more, from the viewpoint of polishing a material to be polished at a further excellent polishing rate. The upper limit of the absorbance for light having a wavelength of 290 nm is not particularly limited, but it is preferably 10.000 or less, for example.

A material to be polished can be polished at a further excellent polishing rate in the case where the abrasive grains which produce absorbance of 1.00 or more for light having a wavelength of 400 nm produce absorbance of 1.000 or more for light having a wavelength of 290 nm in an aqueous dispersion having a content of the abrasive grains adjusted to 0.0065 mass %.

The hydroxide of a tetravalent metal element (for example, $M(OH)_a X_b$) tends not to absorb light having a wavelength of 450 nm or more, particularly light having a wavelength of 450 to 600 nm. Therefore, from the viewpoint of suppressing adverse impacts on polishing by inclusion of impurities and polishing a material to be polished at a further excellent polishing rate, the abrasive grains preferably produce absorbance of 0.010 or less for light having a wavelength of 450 to 600 nm in an aqueous dispersion having a content of the abrasive grains adjusted to 0.0065 mass % (65 ppm). More specifically, absorbance for all of light within a range of a wavelength of 450 to 600 nm preferably does not exceed 0.010 in the aqueous dispersion having a content of the abrasive grains adjusted to 0.0065 mass %. The lower limit of the absorbance for light having a wavelength of 450 to 600 nm is preferably 0.

The absorbance in an aqueous dispersion can be measured, for example, using a spectrophotometer (device name: U3310) manufactured by Hitachi, Ltd. Specifically, for example, an aqueous dispersion having a content of the abrasive grains adjusted to 1.0 mass % or 0.0065 mass % is prepared as a measuring sample. Approximately 4 mL of the measuring sample is poured into a 1-cm square cell, and the cell is placed in the device. Next, absorbance measurement is performed within a range of a wavelength of 200 to 600 nm, and the absorbance is determined from the obtained chart.

If absorbance of 1.00 or more is exhibited in the case where the absorbance for light having a wavelength of 400 nm is measured by excessively diluting such that the content of the abrasive grains is less than 1.0 mass %, the absorbance may be screened by assuming that the absorbance is 1.00 or more in the case where the content of the abrasive grains is 1.0 mass %. If absorbance of 1.000 or more is exhibited in the case where the absorbance for light having a wavelength of 290 nm is measured by excessively diluting such that the content of the abrasive grains is less than 0.0065 mass %, the absorbance may be screened by assuming that the absorbance is 1.000 or more in the case where the content of the abrasive grains is 0.0065 mass %. If absorbance of 0.010 or less is exhibited in the case where the absorbance for light having a wavelength of 450 to 600 nm is measured by diluting such that the content of the abrasive grains is more than 0.0065 mass %, the absorbance may be screened by assuming that the absorbance is 0.010 or less in the case where the content of the abrasive grains is 0.0065 mass %.

The absorbance and light transmittance in which the abrasive grains produce in the aqueous dispersion can be measured by, after removing solid components other than the abrasive grains and liquid components other than water, preparing an aqueous dispersion having a predetermined abrasive grain content and using the aqueous dispersion. For removing the solid components or the liquid components, although varying depending on components comprised in the polishing agent, centrifugation methods such as centrifugation using a centrifuge capable of applying gravitational acceleration of several thousand G or less, and ultracentrifugation using an ultracentrifuge capable of applying gravitational acceleration of several tens of thousands G or more; chromatography methods such as partition chromatography, adsorption chromatography, gel permeation chromatography, and ion-exchange chromatography; filtration methods such as natural filtration, filtration under reduced pressure, pressure filtration, and ultrafiltration; distillation methods such as distillation under reduced pressure, and atmospheric distillation; or the like, can be used, or these may be combined as appropriate.

Examples of methods in the case where the polishing agent comprises a compound having a weight-average molecular weight of several tens of thousands or more (for example, 50000 or more) include chromatography methods and filtration methods, and gel permeation chromatography and ultrafiltration are preferable. In the case of using filtration methods, the abrasive grains comprised in the polishing agent can be made to pass through a filter by setting appropriate conditions. Examples of methods in the case where the polishing agent comprises a compound having a weight-average molecular weight of several tens of thousands or less (for example, less than 50000) include chromatography methods, filtration methods, and distillation methods, and gel permeation chromatography, ultrafiltration, and distillation under reduced pressure are preferable. Examples of methods in the case where the polishing agent comprises abrasive grains other than the abrasive grains including the hydroxide of a tetravalent metal element include filtration methods and centrifugation methods, and much abrasive grains including the hydroxide of a tetravalent metal element are comprised in a filtrate in the case of filtration and in a liquid phase in the case of centrifugation.

As a method for separating the abrasive grains by the above-described chromatography methods, for example, the abrasive grain can be fractionated and/or other components can be fractionated by the following conditions.

Sample solution: polishing agent 100 μL
Detector: UV-VIS Detector manufactured by Hitachi, Ltd., product name "L-4200", wavelength: 400 nm
Integrator: GPC Integrator manufactured by Hitachi, Ltd., product name "D-2500"
Pump: manufactured by Hitachi, Ltd., product name "L-7100"
Column: packing column for water-based HPLC manufactured by Hitachi Chemical Co., Ltd., product name "GL-W550S"
Eluent: deionized water
Measuring temperature: 23° C.
Flow rate: 1 mL/min (pressure: about 40 to 50 kg/cm$^2$)
Measurement time: 60 min It is to be noted that deaeration treatment of an eluent is preferably performed using a deaerator before performing chromatography. In the case where a deaerator cannot be used, an eluent is preferably deaeration-treated in advance with ultrasonic wave or the like.

The abrasive grain may not be able to be fractionated under the above-described conditions depending on components comprised in the polishing agent, in this case, the abrasive grain can be separated by optimizing the amount of a sample solution, the kind of a column, the kind of an eluent, a measuring temperature, a flow rate, or the like. Moreover, by adjusting the pH of the polishing agent, distillation time of the components comprised in the polishing agent is adjusted, and it may be separated from the abrasive grains. In the case where the polishing agent comprises insoluble components, the insoluble components are preferably removed by filtration, centrifugation or the like, as necessary.

[Preparation Method of Abrasive Grains]

The hydroxide of a tetravalent metal element can be prepared by causing a salt of a tetravalent metal element (metal salt) to react with an alkali source (base). The hydroxide of a tetravalent metal element is preferably prepared by mixing a salt of a tetravalent metal element with an alkali liquid (for example, alkali aqueous solution). This makes it possible to obtain particles having an extremely fine particle diameter, and obtain a polishing agent which further excels in a reducing effect on polishing scratches. Such a method is disclosed in Patent Literature 4, for example. The hydroxide of a tetravalent metal element can be obtained by mixing a metal salt solution comprising a salt of a tetravalent metal element (for example, metal salt aqueous solution) with an alkali liquid. It is to be noted that, in the case where at least one of the salt of a tetravalent metal element and the alkali source is supplied to a reaction system in a liquid state, a means for stirring a mixed liquid is not limited. Examples thereof include a method of stirring the mixed liquid using a rod-like, plate-like or propeller-like stirrer, or stirring blade, which rotates around a rotation axis; a method of stirring the mixed liquid by rotating a stirrer using a magnetic stirrer which transmits power from the outside of a container with a rotating magnetic field; a method of stirring the mixed liquid with a pump placed on the outside of a tank; and a method of stirring the mixed liquid by pressurizing outside air and furiously blowing it into a tank. As the salt of a tetravalent metal element, known one may be used without any particular restrictions, and examples thereof include $M(NO_3)_4$, $M(SO_4)_2$, $M(NH_4)_2(NO_3)_6$, $M(NH_4)_4(SO_4)_4$ (where M represents a rare earth metal element) and $Zr(SO_4)_2 \cdot 4H_2O$, among these, $M(NH_4)_2(NO_3)_6$ is preferable. M is preferably cerium (Ce) which is chemically active. As described above, the salt of a tetravalent metal element (metal salt) is more preferably ceric ammonium nitrate $(Ce(NH_4)_2(NO_3)_6)$.

Examples of a means for adjusting the absorbance and the light transmittance include optimization of the manufacturing method of the hydroxide of a tetravalent metal element. Specific examples of a method for altering the absorbance for light having a wavelength of 400 nm and the absorbance for light having a wavelength of 290 nm include selection of the alkali source in the alkali liquid, adjustment of the raw material concentrations in the metal salt solution and the alkali liquid, adjustment of the mixing rate of the metal salt solution and the alkali liquid, and adjustment of the liquid temperature of the mixed liquid obtained by mixing the salt of a tetravalent metal element with the alkali source. Specific examples of a method for altering the light transmittance for light having a wavelength of 500 nm include adjustment of the raw material concentrations in the metal salt solution and the alkali liquid, adjustment of the mixing rate of the metal salt solution and the alkali liquid, adjustment of the stirring rate when mixing, and adjustment of the liquid temperature of the mixed liquid.

In order to increase the absorbance for light having a wavelength of 400 nm, the absorbance for light having a wavelength of 290 nm, and the light transmittance for light having a wavelength of 500 nm, the manufacturing method of the hydroxide of a tetravalent metal element is preferably more "moderate". The term "moderate" means that an increase in pH is moderated (slowed) when the pH of the reaction system is increased as the reaction proceeds. Conversely, in order to reduce the absorbance for light having a wavelength of 400 nm, the absorbance for light having a wavelength of 290 nm, and the light transmittance for light having a wavelength of 500 nm, the manufacturing method of the hydroxide of a tetravalent metal element is preferably more "intensive". The term "intensive" means that an increase in pH is intensified (quickened) when the pH of the reaction system is increased as the reaction proceeds. In order for the values of the absorbance and the light transmittance to be in predetermined ranges, the manufacturing method of the hydroxide of a tetravalent metal element is preferably optimized by reference to the above-described tendency. Hereinafter, a controlling method of the absorbance and the light transmittance will be described in more detail.

{Alkali Source}

As the alkali source in the alkali liquid, known one can be used without any particular restrictions. Examples of the alkali source include organic bases and inorganic bases. Examples of the organic bases include nitrogen-containing organic bases such as guanidine, triethylamine, and chitosan; nitrogen-containing heterocyclic organic bases such as pyridine, piperidine, pyrrolidine, and imidazole; and ammonium salts such as ammonium carbonate, ammonium hydrogen carbonate, tetramethylammonium hydroxide (TMAH), tetraethylammonium hydroxide, tetramethylammonium chloride, and tetraethylammonium chloride. Examples of the inorganic bases include ammonia, and inorganic salts of alkali metal, such as lithium hydroxide, sodium hydroxide, potassium hydroxide, calcium hydroxide, lithium carbonate, sodium carbonate, potassium carbonate, lithium hydrogen carbonate, sodium hydrogen carbonate, and potassium hydrogen carbonate. The alkali sources can be used singly or in combinations of two or more.

From the viewpoint of further improving the polishing rate for insulating material, the alkali source is preferably ammonia and imidazole, and further preferably imidazole. In order to increase the absorbance for light having a wavelength of 400 nm and the absorbance for light having a wavelength of 290 nm, as the alkali source, an alkali source which exhibits weak basicity is preferably used. Among the alkali sources, nitrogen-containing heterocyclic organic bases are preferable, pyridine, piperidine, pyrrolidine and imidazole are more preferable, pyridine and imidazole are further preferable, and imidazole is particularly preferable.

{Concentration}

By controlling the raw material concentrations in the metal salt solution and the alkali liquid, the absorbance for light having a wavelength of 400 nm, the absorbance for light having a wavelength of 290 nm, and the light transmittance for light having a wavelength of 500 nm can be altered. Specifically, the absorbance tends to be increased by increasing the metal salt concentration of the metal salt solution, and the absorbance tends to be increased by decreasing the alkali concentration (concentration of base, concentration of alkali source) of the alkali liquid. The light transmittance tends to be increased by increasing the metal salt concentration, and the light transmittance tends to be increased by decreasing the alkali concentration.

From the viewpoint of making it easier to achieve both an excellent polishing rate and excellent stability of the abrasive grains, the upper limit of the metal salt concentration in the metal salt solution is preferably 1.000 mol/L or less, more preferably 0.500 mol/L or less, further preferably 0.300 mol/L or less, and particularly preferably 0.200 mol/L or less, based on the total of the metal salt solution. From the viewpoint of capable of suppressing rapid occurrence of a reaction (capable of moderating increase in pH) and increasing the absorbance for light having a wavelength of 400 nm, the absorbance for light having a wavelength of 290 nm, and the light transmittance for light having a wavelength of 500 nm, the lower limit of the metal salt concentration is preferably 0.010 mol/L or more, more preferably 0.020 mol/L or more, and further preferably 0.030 mol/L or more, based on the total of the metal salt solution.

From the viewpoint of suppressing rapid occurrence of a reaction, the upper limit of the alkali concentration in the alkali liquid is preferably 15.0 mol/L or less, more preferably 12.0 mol/L or less, and further preferably 10.0 mol/L or less, based on the total of the alkali liquid. The lower limit of the alkali concentration is not particularly limited, but from the viewpoint of productivity, it is preferably 0.001 mol/L or more based on the total of the alkali liquid.

It is preferable that the alkali concentration in the alkali liquid is adjusted as appropriate depending on the alkali source selected. For example, in the case of an alkali source having pKa of conjugate acid of the alkali source of 20 or more, from the viewpoint of suppressing rapid occurrence of a reaction, the upper limit of the alkali concentration is preferably 0.10 mol/L or less, and more preferably 0.05 mol/L or less, based on the total of the alkali liquid. The lower limit of the alkali concentration is not particularly limited, but from the viewpoint of suppressing the amount used of a solution used for obtaining a predetermined amount of the hydroxide of a tetravalent metal element, it is preferably 0.001 mol/L or more based on the total of the alkali liquid.

In the case of an alkali source having pKa of conjugate acid of the alkali source of 12 or more and less than 20, from the viewpoint of suppressing rapid occurrence of a reaction, the upper limit of the alkali concentration is preferably 1.0 mol/L or less, and more preferably 0.50 mol/L or less, based on the total of the alkali liquid. The lower limit of the alkali concentration is not particularly limited, but from the viewpoint of suppressing the amount used of a solution used for obtaining a predetermined amount of the hydroxide of a tetravalent metal element, it is preferably 0.01 mol/L or more based on the total of the alkali liquid.

In the case of an alkali source having pKa of conjugate acid of the alkali source of less than 12, from the viewpoint of suppressing rapid occurrence of a reaction, the upper limit of the alkali concentration is preferably 15.0 mol/L or less, and more preferably 10.0 mol/L or less, based on the total of the alkali liquid. The lower limit of the alkali concentration is not particularly limited, but from the viewpoint of suppressing the amount used of a solution used for obtaining a predetermined amount of the hydroxide of a tetravalent metal element, it is preferably 0.10 mol/L or more based on the total of the alkali liquid.

Examples of the alkali source having pKa of conjugate acid of the alkali source of 20 or more include 1,8-diazabicyclo[5.4.0]undec-7-ene (pKa: 25). Examples of the alkali source having pKa of conjugate acid of the alkali source of 12 or more and less than 20 include potassium hydroxide (pKa: 16) and sodium hydroxide (pKa: 13). Examples of the alkali source having pKa of conjugate acid of the alkali source of less than 12 include ammonia (pKa: 9) and imidazole (pKa: 7). The pKa value of conjugate acid of the alkali source used is not particularly limited as long as the alkali concentration is appropriately adjusted, but pKa of conjugate acid of the alkali source is preferably less than 20, more preferably less than 12, further preferably less than 10, and particularly preferably less than 8.

{Mixing Rate}

By controlling the mixing rate of the metal salt solution and the alkali liquid, the absorbance for light having a wavelength of 400 nm, the absorbance for light having a wavelength of 290 nm, and the light transmittance for light having a wavelength of 500 nm can be altered. Each of the absorbance and light transmittance tend to be increased by adjusting such that an increase in pH is moderated (slowed). More specifically, the absorbance tends to be increased by slowing the mixing rate, and the absorbance tends to be decreased by quickening the mixing rate. The light transmittance tends to be increased by slowing the mixing rate, and the light transmittance tends to be decreased by quickening the mixing rate.

From the viewpoint of further suppressing rapid progression of a reaction and further suppressing bias of a reaction in a limited part, the upper limit of the mixing rate is preferably $5.00 \times 10^{-3}$ m$^3$/min (5 L/min) or less, more preferably $1.00 \times 10^{-3}$ m$^3$/min (1 L/min) or less, further preferably $5.00 \times 10^{-4}$ m$^3$/min (500 mL/min) or less, particularly preferably $1.00 \times 10^{-4}$ m$^3$/min (100 mL/min) or less, extremely preferably $1.00 \times 10^{-5}$ m$^3$/min (10 mL/min) or less, and very preferably $5.00 \times 10^{-6}$ m$^3$/min (5 mL/min) or less. The lower limit of the mixing rate is not particularly limited, but from the viewpoint of productivity, it is preferably $1.00 \times 10^{-7}$ m$^3$/min (0.1 mL/min) or more.

{Stirring Rate}

By controlling the stirring rate when mixing the metal salt solution and the alkali liquid, the light transmittance for light having a wavelength of 500 nm can be altered. Specifically, the light transmittance tends to be increased by quickening the stirring rate, and the light transmittance tends to be decreased by slowing the stirring rate.

From the viewpoint of capable of further suppressing bias of a reaction in a limited part and excelling in mixing efficiency, the lower limit of the stirring rate is preferably 30 min$^{-1}$ or more, more preferably 50 min$^{-1}$ or more, further preferably 80 min$^{-1}$ or more, particularly preferably 100 min$^{-1}$ or more, and extremely preferably 120 min$^{-1}$ or more. The upper limit of the stirring rate is not particularly limited, and furthermore, it needs to be adjusted as appropriate depending on the size and the shape of the stirring blade, but from the viewpoint of suppressing splash of a liquid, it is preferably 1000 min$^{-1}$ or less.

{Liquid Temperature (Synthesis Temperature)}

By controlling the liquid temperature of the mixed liquid obtained by mixing the salt of a tetravalent metal element with the alkali source, the absorbance for light having a wavelength of 400 nm, the absorbance for light having a wavelength of 290 nm, and the light transmittance for light having a wavelength of 500 nm can be altered, and abrasive grains capable of achieving a desired polishing rate and storage stability can be obtained. Specifically, the absorbance tends to be increased by lowering the liquid temperature, and the absorbance tends to be decreased by raising the liquid temperature. The light transmittance tends to be increased by lowering the liquid temperature, and the light transmittance tends to be decreased by raising the liquid temperature.

The liquid temperature is, for example, a temperature in the mixed liquid, which can be read with a thermometer placed in the mixed liquid, and is preferably 0 to 100° C. From the viewpoint of suppressing a rapid reaction, the upper limit of the liquid temperature is preferably 100° C. or less, more preferably 60° C. or less, further preferably 55° C. or less, particularly preferably 50° C. or less, and extremely preferably 45° C. or less. From the viewpoint of making a reaction easily proceed, the lower limit of the liquid temperature is preferably 0° C. or more, more preferably 10° C. or more, further preferably 20° C. or more, and particularly preferably 30° C. or more.

The hydroxide of a tetravalent metal element synthesized by the method above sometimes contains impurities (for example, metal impurities), but the impurities can be removed by washing. Washing of the hydroxide of a tetravalent metal element can be accomplished by a method for repeated solid-liquid separation by centrifugal separation or the like. Washing can also be accomplished by ion removal using centrifugal separation, dialysis, ultrafiltration, an ion exchange resin or the like. The absorbance for light having a wavelength of 450 to 600 nm can be adjusted by removing impurities.

When the obtained abrasive grains are aggregated, they can be dispersed in a fluid medium by an appropriate method. The method for dispersing the abrasive grains in a fluid medium (for example, water) may be mechanical dispersion treatment with a homogenizer, an ultrasonic disperser, a wet ball mill or the like, in addition to dispersion treatment with a stirrer. The dispersion method and particle diameter control method may be the methods described in Non-Patent Literature 1, for example. It is possible to increase the dispersibility of the abrasive grains by performing the washing treatment above to lower the electric conductivity (for example, 500 mS/m or less) of the dispersion containing the abrasive grains. Thus, the washing treatment above may be applied as dispersion treatment, or the washing treatment above and dispersion treatment may be combined.

(Additives)

The polishing agent of the present embodiment comprises an additive. The term "additive" refers to a substance which is added to the polishing agent in addition to a fluid medium and abrasive grains, in order to adjust the polishing properties such as polishing rate and polishing selectivity; the polishing agent properties such as abrasive grain dispersibility and storage stability, or the like.

[First Additive: Compound Having Polyoxyalkylene Chain and Vinyl Alcohol Polymer]

The polishing agent of the present embodiment comprises at least one selected from the group consisting of a compound having a polyoxyalkylene chain and a vinyl alcohol polymer (excluding a compound corresponding to the compound having a polyoxyalkylene chain), as a first additive. Since the first additive has a plurality of oxygen atoms in the molecule, the first additive has a suppressing effect on excessive increase in the polishing rate for stopper material. It is conjectured that covering of the stopper material by the first additive moderates progression of polishing by the abrasive grains and suppresses excessive increase in the polishing rate for stopper material.

The first additive is preferably a compound having a polyoxyalkylene chain from the viewpoint of further improving flatness. Specifically, the first additive is preferably at least one selected from the group consisting of polyalkylene glycol, a polyoxyalkylene derivative and polyglycerin, and more preferably at least one selected from the group consisting of polyalkylene glycol and a polyoxyalkylene derivative.

Examples of polyalkylene glycol include polyethylene glycol, polypropylene glycol and polybutylene glycol, and from the viewpoint of further improving flatness, at least one selected from the group consisting of polyethylene glycol and polypropylene glycol is preferable, and polyethylene glycol is more preferable.

Examples of the polyoxyalkylene derivative include a compound obtained by introducing a functional group and/or a substituent group into polyalkylene glycol, and a compound obtained by adding polyalkylene oxide to an organic compound. Examples of the functional group and substituent group include alkyl ether, alkylphenyl ether, phenyl ether, styrenated phenyl ether, alkylamine, fatty acid ester, glycol ester, polyglyceryl ether, diglyceryl ether, sugar ether and sugar ester.

Examples of the polyoxyalkylene derivative include polyoxyethylene styrenated phenyl ether (for example, NOIGEN (registered trademark) EA series manufactured by Dai-Ichi Kogyo Seiyaku Co., Ltd.); polyoxyethylene alkyl ether (for example, EMULGEN (registered trademark) series manufactured by Kao Corporation); polyoxyethylene alkyl phenyl ether (for example, EMULZIT (registered trademark) series manufactured by Dai-Ichi Kogyo Seiyaku Co., Ltd.); polyoxyethylene sorbitan fatty acid ester (for example, SOLGEN (registered trademark) TW series manufactured by Dai-Ichi Kogyo Seiyaku Co., Ltd.); polyoxy ethylene fatty acid ester (for example, EMANON (registered trademark) series manufactured by Kao Corporation); polyoxyethylene alkylamine (for example, AMIRAZIN (registered trademark) D manufactured by Dai-Ichi Kogyo Seiyaku Co., Ltd.); polyoxypropylene sorbitol (for example, UNIOL (registered trademark) HS-1600D manufactured by NOF Corporation); polyoxyalkylene diglyceryl ethers such as polyoxy ethylene diglyceryl ether (for example, SC-E series manufactured by Sakamoto Yakuhin Kogyo Co., Ltd.) and polyoxypropylene diglyceryl ether (for example, SY-DP series manufactured by Sakamoto Yakuhin Kogyo Co., Ltd.); polyoxyalkylene polyglyceryl ethers such as polyoxy ethylene polyglyceryl ether and polyoxypropylene polyglyceryl ether; and a compound having added polyalkylene oxide (for example, SURFYNOL (registered trademark) 465 manufactured by Air Products Japan; TMP series manufactured by Nippon Nyukazai Co., Ltd.).

Polyglycerin is a polyglycerin with a glycerin mean polymerization degree of 3 or more (polyglycerin which is a trimer or more). The lower limit of the mean polymerization degree of the polyglycerin is 3 or more, preferably 4 or more, more preferably 5 or more and further preferably 10 or more, from the viewpoint of increasing the polishing rate for insulating material. The upper limit of the mean polymerization degree of the polyglycerin is not particularly limited, but from the viewpoint of production, it is preferably 100 or less, more preferably 50 or less, and further preferably 30 or less. From the above viewpoints, the mean polymerization degree of the polyglycerin is more preferably 3 or more and 100 or less.

A "vinyl alcohol polymer" is ideally a polymer having the following structural formula.

[Chemical Formula 1]

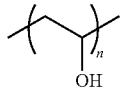

[In the formula, n represents a positive integer.]

However, since vinyl alcohol generally tends not to exist alone as stable compounds, the vinyl alcohol polymer is obtained by polymerizing a vinyl carboxylate monomer such as vinyl acetate monomer to obtain poly(vinyl carboxylate), followed by saponification (hydrolysis) for this. Thus, a vinyl alcohol polymer obtained using vinyl acetate monomer as the starting material, for example, has —OCOCH$_3$ and hydrolyzed —OH as functional groups in the molecule, and the proportion of —OH is defined as the saponification degree. That is, a vinyl alcohol polymer whose saponification degree is not 100% has a structure which is substantially a copolymer of vinyl acetate and vinyl alcohol. The vinyl alcohol polymer may also be one in which a vinyl carboxylate monomer such as vinyl acetate monomer and other vinyl group-containing monomer (for example, ethylene, propylene, styrene or vinyl chloride) are copolymerized, and all or some of the portions derived from the vinyl carboxylate monomer are then saponified. Specific examples of such vinyl alcohol polymer include PVA-403 manufactured by Kuraray Co., Ltd. and JC-25 manufactured by Japan Vam & Poval Co., Ltd. Herein, all of these are collectively defined as "vinyl alcohol polymers".

The vinyl alcohol polymer may be a derivative of a homopolymer of vinyl alcohol (that is, a polymer with a saponification degree of 100%), and derivatives of copolymers of vinyl alcohol monomer and other vinyl group-containing monomers (for example, ethylene, propylene, styrene, vinyl chloride and vinyl acetate). Examples of the aforementioned derivatives include compounds having at least a portion of the hydroxyl groups substituted with amino, carboxyl, ester groups or the like, and compounds having at least a portion of the hydroxyl groups modified, and specific examples thereof include reactive vinyl alcohol polymers (for example, GOHSEFIMER (registered trademark) Z manufactured by Nippon Synthetic Chemical Industry Co., Ltd.), cationized vinyl alcohol polymers (for example, GOHSEFIMER (registered trademark) K manufactured by Nippon Synthetic Chemical Industry Co., Ltd.), anionized vinyl alcohol polymers (for example, GOHSERAN (registered trademark) L and GOHSENOL (registered trademark) T manufactured by Nippon Synthetic Chemical Industry Co., Ltd.), and hydrophilic group-modified vinyl alcohol polymers (for example, ECOMATI manufactured by Nippon Synthetic Chemical Industry Co., Ltd.).

The upper limit of the saponification degree of the vinyl alcohol polymer is preferably 90 mol % or less, more preferably 85 mol % or less, and further preferably 80 mol % or less, from the viewpoint of obtaining more excellent polishing selectivity for insulating material with respect to stopper material. The lower limit of the saponification degree is not particularly limited, but from the viewpoint of excellent solubility in water, it is preferably 50 mol % or more, more preferably 60 mol % or more, and further preferably 70 mol % or more. The saponification degree of the vinyl alcohol polymer can be measured according to JIS K 6726 (polyvinyl alcohol test method).

The upper limit of the mean polymerization degree of the vinyl alcohol polymer is not particularly limited, but from the viewpoint of further improving the polishing rate for insulating material, it is preferably 3000 or less, more preferably 2000 or less, and further preferably 1000 or less. From the viewpoint of obtaining a more excellent polishing selective ratio for insulating material with respect to stopper material, the lower limit of the mean polymerization degree is preferably 50 or more, more preferably 100 or more, and further preferably 150 or more. The mean polymerization degree of the vinyl alcohol polymer can be measured according to JIS K 6726 (polyvinyl alcohol test method).

The first additive can be used as a single type alone or as a combination of two or more types, for the purpose of adjusting polishing properties such as polishing selectivity and flatness.

From the viewpoint of further improving the polishing rate for insulating material (for example, silicon oxide), the upper limit of the weight-average molecular weight of the first additive is preferably 100×10$^3$ or less, more preferably 80×10$^3$ or less, further preferably 50×10$^3$ or less, particularly preferably 40×10$^3$ or less, and extremely preferably 30×10$^3$ or less. From the viewpoint of further improving the polishing selectivity and flatness, the lower limit of the weight-average molecular weight of the first additive is preferably 250 or more, more preferably 400 or more, and further preferably 500 or more. When the first additive is polyglycerin, the upper limit of the weight-average molecular weight of the first additive is preferably 250 or more, more preferably 400 or more, further preferably 500 or more, particularly preferably 700 or more, and extremely preferably 750 or more, from the viewpoint of further improving the polishing rate for insulating material.

The weight-average molecular weight can be measured by gel permeation chromatography (GPC) under the following conditions, using a calibration curve of standard polystyrene, for example.

Device: Hitachi Model L-6000 [manufactured by Hitachi, Ltd.]

Column: GL-R420 Gel pack (registered trademark)+GL-R430 Gel pack (registered trademark)+GL-R440 Gel pack (registered trademark) (total of 3, trade name, Hitachi Chemical Co., Ltd.)

Eluent: Tetrahydrofuran

Measuring temperature: 40° C.

Flow rate: 1.75 mL/min

Detector: L-3300RI [manufactured by Hitachi, Ltd.]

From the viewpoint of further improving the polishing rate for insulating material, the lower limit of the first additive content is preferably 0.01 mass % or more, more preferably 0.04 mass % or more, further preferably 0.1 mass % or more, and particularly preferably 0.3 mass % or more, based on the total mass of the polishing agent. From the viewpoint of suppressing excessive increase in the viscosity of the polishing agent, the upper limit of the first additive content is preferably 10 mass % or less, more preferably 5.0 mass % or less, further preferably 3.0 mass % or less, and particularly preferably 2.0 mass % or less, based on the total mass of the polishing agent. From these viewpoints, the first additive content is more preferably 0.01 mass % or more and 10 mass % or less, based on the total mass of the polishing agent. When a plurality of compounds are used as the first additive, the total content of each of the compounds preferably satisfies the range specified above. The content of the first additive is preferably adjusted as appropriate depending on the method for preparing the insulating material (the type and the film-forming condition), from the viewpoint of further improving the polishing rate for insulating material, polishing selectivity for insulating material with respect to stopper material, and flatness.

[Second Additive: Cationic Polymer]

The polishing agent of the present embodiment comprises a cationic polymer as a second additive in addition to the first additive. The "cationic polymer" is a polymer having a cationic group, or a group which can be ionized to a cationic group, on the main chain or the side chain. The first additive is not included in the "second additive".

The second additive has a suppressing effect on the polishing rate for stopper material, by using in combination with the first additive. It is thought that, since the second additive adsorbs onto the insulating material more readily, the excess first additive which is not able to be adsorbed due to adsorption of the second additive is adsorbed more thickly onto the stopper material surface, thereby suppressing polishing of the stopper material. The second additive also has an improving effect on the polishing rate for insulating material. When the first additive excessively covers the insulating material, the polishing rate for insulating material is thought to be lowered. However, when the second additive is used together, it is though that interaction between the first additive and the second additive suppresses excessive covering of the insulating material. Thus, the polishing agent of the present embodiment can improve the polishing selectivity for insulating material with respect to stopper material.

The second additive also has an increasing effect on the polishing rate for insulating material without impairing flatness. The first additive suitably cover the insulating material due to the presence of the second additive. Thereby, it is thought that the polishing rate for concave parts of the insulating material is suppressed while improving the polishing rate for convex parts of the insulating material, allowing high flatness to be maintained.

The second additive is preferably at least one selected from the group consisting of an allylamine polymer, a diallylamine polymer, a vinylamine polymer and an ethyleneimine polymer, from the viewpoint of obtaining more excellent polishing selectivity for insulating material with respect to stopper material. These polymers can be obtained by polymerizing at least one monomer component selected from the group consisting of an allylamine compound, a diallylamine compound, a vinylamine compound, an ethyleneimine compound and their derivatives. The polymers may have a structural unit derived from a monomer component other than an allylamine compound, a diallylamine compound, a vinylamine compound, an ethyleneimine compound and their derivatives, and it may have a structural unit derived from acrylamide, dimethylacrylamide, diethylacrylamide, hydroxyethylacrylamide, acrylic acid, methyl acrylate, methacrylic acid, maleic acid, sulfur dioxide or the like.

The second additive may be a homopolymer of an allylamine compound, a diallylamine compound, a vinylamine compound, an ethyleneimine compound or their derivatives. It may be a copolymer having a structural unit derived from an allylamine compound, a diallylamine compound, a vinylamine compound, an ethyleneimine compound or their derivatives. The structural unit in the copolymer may have any desired sequence. For example, it may have any desired forms including (a) the form of a block copolymer with the same structural units in continuity, (b) the form of a random copolymer having a structural unit A and a structural unit B arranged in no particular order, (c) the form of an alternating copolymer having a structural unit A and a structural unit B in an alternating arrangement, or the like.

The allylamine polymer is a polymer obtained by polymerizing an allylamine compound or its derivative, and examples thereof include a polymer having a structural unit represented by the following general formula (I) or (II). Examples of the allylamine compound include allylamine, methylallylalmine, dimethylallylalmine and trimethylallylammonium salts. Examples of the derivative of the allylamine compound include alkoxycarbonylated allylamine, methylcarbonylated allylamine, aminocarbonylated allylamine and ureated allylamine.

[Chemical Formula 2]

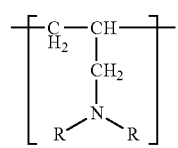
(I)

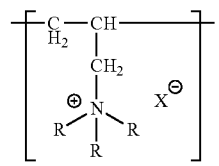
(II)

[In the formula, R each independently represents a hydrogen atom or a monovalent organic group, and X⁻ represents an anion.]

The diallylamine polymer is a polymer obtained by polymerizing a diallylamine compound or its derivative, and examples thereof include a polymer having a structural unit represented by the following general formula (III) or (IV). Examples of the diallylamine compound include diallylamine, methyldiallylamine, tert-butyldiallylamine, N,N-diarylaniline, N,N-diarylbenzylamin, and (α-methylbenzyl)diarylamine. Examples of the derivative of the diallylamine compound include a diallyldimethylammonium salt, a diallylmethylethylammonium salt, acylated diallylamine, aminocarbonylated diallylamine, alkoxycarbonylated diallylamine, aminothiocarbonylated diallylamine and hydroxyalkylated diallylamine. Examples of the ammonium salt includes ammonium chloride.

[Chemical Formula 3]

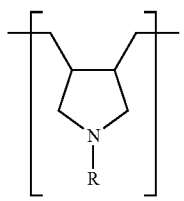

(III)

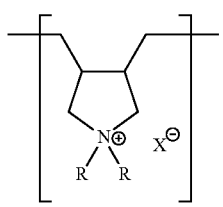

(IV)

[In the formula, R each independently represents a hydrogen atom or a monovalent organic group, and X⁻ represents an anion.]

The vinylamine polymer is a polymer obtained by polymerizing a vinylamine compound or its derivative, and examples thereof include a polymer having a structural unit represented by the following general formula (V). Examples of the vinylamine compound include vinyl amine, methylvinylamine, N,N-dimethylvinylamine, vinylethylamine, N,N-diethylvinylamine, N-vinylaniline, vinylbenzylamine, tert-butylvinylamine and allylvinylamine. Examples of the derivative of the vinylamine compound include alkylated vinylamine, amidated vinylamine, ethylene oxidated vinylamine, propylene oxidated vinylamine, alkoxylated vinylamine, carboxymethylated vinylamine, acylated vinylamine and ureated vinylamine.

[Chemical Formula 4]

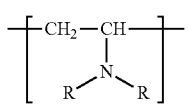

(V)

[In the formula, R each independently represents a hydrogen atom or a monovalent organic group.]

The ethyleneimine polymer is a polymer obtained by polymerizing an ethyleneimine compound or its derivative, and examples thereof include a polymer having a structural unit represented by the following general formula (VI). Examples of the ethyleneimine compound include ethyleneimine. Examples of the ethyleneimine derivative include an aminoethylated acrylic polymer, alkylated ethyleneimine, ureated ethyleneimine and propylene oxidated ethyleneimine.

[Chemical Formula 5]

(VI)

[In the formula, R represents a hydrogen atom or a monovalent organic group.]

Examples of the monovalent organic group of R in the formulae (I) to (VI) include alkyl groups such as a methyl group and an ethyl group; and allyl groups. Examples of X⁻ in the formulae (II) and (IV) include a chloride ion, an ethyl sulfate ion and a methyl sulfate ion.

The second additive used may be acrylic polymers such as cation-modified polyacrylamide and cation-modified polydimethylacrylamide; polysaccharides such as chitosan, a chitosan derivative, cation-modified cellulose and cation-modified dextran; and a copolymer obtained by polymerizing a monomer derived from a structural unit composing these compounds.

From the viewpoint of further suppressing progression of dishing and generation of polishing scratches at the surface to be polished while further improving the polishing selectivity for insulating material with respect to stopper material, the second additive is preferably an allylamine polymer, a diallylamine polymer and an ethyleneimine polymer. From the same viewpoint, the allylamine polymer is preferably a homopolymer in which all of R are hydrogen atoms in the formula (I); the ethyleneimine polymer is preferably a homopolymer in which R is hydrogen atom in the formula (VI); the diallylamine polymer is preferably a homopolymer in which all of R are organic groups in the formula (IV), a copolymer of a monomer in which all of R are organic groups in the formula (IV) and acrylamide, and a copolymer of a monomer in which all of R are organic groups in the formula (IV) and acrylic acid. The second additive is preferably, for example, polyallylamine, polyethyleneimine, a diallyldimethylammonium chloride/acrylamide copolymer and a diallyldimethylammonium chloride/acrylic acid copolymer. The second additive is preferably polyallylamine, polyethyleneimine and a diallyldimethylammonium chloride/acrylamide copolymer, from the viewpoint of further improving the polishing selectivity for insulating material with respect to stopper material and from the viewpoint of further improving the polishing rate for insulating material. The second additive used can be a single type or a combination of two or more types, for the purpose of adjusting the polishing properties such as polishing selectivity and flatness.

The lower limit of the weight-average molecular weight of the second additive is preferably 100 or more, more preferably 300 or more, further preferably 500 or more, and particularly preferably 1000 or more, from the viewpoint of further improving the polishing selectivity for insulating material with respect to stopper material. The upper limit of the weight-average molecular weight of the second additive is preferably 1000×10³ or less, more preferably 800×10³ or less, further preferably 600×10³ or less, and particularly preferably 400×10³ or less, from the viewpoint of further improving the polishing selectivity for insulating material with respect to stopper material. From the viewpoints above, the weight-average molecular weight of the second additive is more preferably 100 or more and 1000×10³ or less. The weight-average molecular weight of the second additive can be measured by the same method as for the weight-average molecular weight of the first additive.

From the viewpoint of further improving the polishing selectivity and flatness, the lower limit of the content of the second additive is preferably 0.0001 mass % or more, more preferably 0.0003 mass % or more, further preferably 0.0005 mass % or more, and particularly preferably 0.0007 mass % or more, based on the total mass of the polishing agent. From the viewpoint of more excellent polishing selectivity, the upper limit of the content of the second additive is preferably 5 mass % or less, more preferably 3 mass % or less, further preferably 1 mass % or less, particularly preferably 0.5 mass % or less, extremely preferably 0.1 mass % or less, very preferably 0.05 mass % or less, and still further preferably 0.01 mass % or less, based on the total mass of the polishing agent. From the viewpoints above, the content of the second additive is more preferably 0.0001 mass % or more and 5 mass % or less based on the total mass of the polishing agent. When a plurality of compounds are used as the second additive, the total content of each of the compounds preferably satisfies the range specified above. The content of the second additive is preferably adjusted as appropriate depending on the method for preparing the insulating material (the type and the film-forming condition), from the viewpoint of further improving the polishing rate for insulating material, polishing selectivity for insulating material with respect to stopper material, and flatness.

The lower limit of the ratio of the content of the second additive with respect to the content of the first additive is preferably 0.0005 or more, more preferably 0.001 or more, further preferably 0.0015 or more, and particularly preferably 0.002 or more, in terms of mass ratio, from the viewpoint of further improving the polishing selectivity and flatness. The upper limit of the ratio of the content of the second additive with respect to the content of the first additive is preferably 0.03 or less, more preferably 0.025 or less, further preferably 0.02 or less, and particularly preferably 0.015 or less, in terms of mass ratio, from the viewpoint of more excellent polishing selectivity. From the viewpoints above, the ratio of the content is more preferably 0.0005 or more and 0.03 or less.

[Third Additive: Amino Group-Containing Sulfonic Acid Compound]

The polishing agent of the present embodiment comprises an amino group-containing sulfonic acid compound as the third additive, in addition to the first additive and the second additive. The term "amino group-containing sulfonic acid compound" is a compound having at least one selected from the group consisting of a sulfonic group (sulfo group, —$SO_3H$) and a sulfonate group (—$SO_3M$: M is a metal atom), and an amino group (—$NH_3$) in the molecule. Examples of the metal atom M of the sulfonate group include alkali metals such as Na and K, and alkali earth metals such as Mg and Ca. Use of the third additive suppresses polishing of the insulating material (for example, the insulating material embedded in the concave parts) after exposure of the stopper, thereby allowing high flatness to be obtained. However the reason for this is not necessarily clear, present inventors conjecture as follows. More specifically, when polishing is progressed and the stopper is exposed, the area of the insulating material exposed on the surface is considerably decreased rather than before the stopper is exposed. At this time, it is thought that, since the third additive thought to have a high adsorption force to the insulating material and a low adsorption force to the stopper concentrates in the insulating material, the amount of adsorption of the third additive to the insulating material is increased.

The third additive used can be at least one selected from the group consisting of sulfamic acid (alias name: amidosulfonic acid), an aliphatic aminosulfonic acid, an aromatic aminosulfonic acid and salts thereof. Use of such compounds can further improve flatness.

The aliphatic aminosulfonic acid compound is defined as an aliphatic compound having an amino group and a sulfonic group. Specific examples of the aliphatic aminosulfonic acid compound include aminomethanesulfonic acid, aminoethanesulfonic acid (for example, 1-aminoethanesulfonic acid and 2-aminoethanesulfonic acid (alias name: taurine)) and aminopropanesulfonic acid (for example, 1-aminopropane-2-sulfonic acid and 2-aminopropane-1-sulfonic acid). The aromatic aminosulfonic acid is defined as an aromatic compound (preferably, an aromatic hydrocarbon) having an amino group and a sulfonic group. Specific examples of the aromatic aminosulfonic acid include aminobenzenesulfonic acid (for example, orthanilic acid (alias name: 2-aminobenzenesulfonic acid), metanilic acid (alias name: 3-aminobenzenesulfonic acid) and sulfanilic acid (alias name: 4-aminobenzenesulfonic acid)), diaminobenzensulfonic acid (for example, 2,4-diaminobenzensulfonic acid and 3,4-diaminobenzensulfonic acid) and aminonaphthalenesulfonic acid.

From the viewpoint of obtaining higher flatness, the molecular weight of the third additive is preferably 500 or less, more preferably 300 or less, further preferably 250 or less, and particularly preferably 200 or less. The lower limit of the molecular weight is preferably 100 or more, for example.

From the viewpoint of further suppressing polishing of the insulating material after exposure of the stopper (for example, the insulating material embedded in the concave parts), thereby allowing higher flatness to be obtained, the third additive is preferably at least one selected from the group consisting of aliphatic aminosulfonic acid and aromatic aminosulfonic acid, more preferably at least one selected from the group consisting of aminoethanesulfonic acid and aminobenzenesulfonic acid, and further preferably at least one selected from the group consisting of aminoethanesulfonic acid, orthanilic acid, metanilic acid, 2,4-diaminobenzensulfonic acid and sulfanilic acid. The third additive may be used as a single type alone or as a combination of two or more types, for the purpose of adjusting polishing properties such as polishing selectivity and flatness.

From the viewpoint of further improving the flatness, the lower limit of the content of the third additive is preferably 0.0005 mass % or more, more preferably 0.001 mass % or more, further preferably 0.002 mass % or more, and particularly preferably 0.003 mass % or more, based on the total mass of the polishing agent. From the viewpoint of further excelling in a polishing rate for insulating material, the upper limit of the content of the third additive is preferably 0.2 mass % or less, more preferably 0.1 mass % or more, further preferably 0.07 mass % or less, particularly preferably 0.05 mass % or less, extremely preferably 0.03 mass % or less, and very preferably 0.02 mass % or less, based on the total mass of the polishing agent. From the viewpoints above, the content of the third additive is more preferably 0.0005 mass % or more and 0.2 mass % or less based on the total mass of the polishing agent. When a plurality of compounds are used as the third additive, the total content of each of the compounds preferably satisfies the range specified above. The content of the third additive is preferably adjusted as appropriate depending on the method for preparing the insulating material (the type and the film-forming condition), from the viewpoint of further improving the polishing rate for insulating material, polishing selectivity for insulating material with respect to stopper material, and flatness.

[Fourth Additive]

The polishing agent of the present embodiment may further comprise a fourth additive, in addition to the first additive, the second additive and the third additive, for the purpose of adjusting the polishing properties such as a polishing rate; and the polishing agent properties such as abrasive grain dispersibility and storage stability; or the like.

Examples of the fourth additive include carboxylic acid and amino acid. These may be used as a single type alone or as a combination of two or more types. Among these, preferred are carboxylic acid and amino acid, from the viewpoint of excellent balance between abrasive grain dispersibility and polishing properties.

The carboxylic acid has the effect of stabilizing the pH and further improving the polishing rate for insulating material. Examples of the carboxylic acid include formic acid, acetic acid, propionic acid, butyric acid, valeric acid, caproic acid and lactic acid.

The amino acid has the effect of improving the dispersibility of the abrasive grains including the hydroxide of a tetravalent metal element, and further improving the polishing rate for insulating material. Examples of the amino acid include arginine, lysine, aspartic acid, glutamic acid, asparagine, glutamine, histidine, proline, tyrosine, tryptophan, serine, threonine, glycine, α-alanine, β-alanine, methionine, cysteine, phenylalanine, leucine, valine and isoleucine. The amino acid has a carboxyl group, but it is defined as one different from the carboxylic acid.

When the fourth additive is used, the content of the fourth additive is preferably 0.01 mass % or more and 10 mass % or less, based on the total mass of the polishing agent, from the viewpoint of obtaining an addition effect of the fourth additive while suppressing sedimentation of the abrasive grains. When a plurality of compounds are used as the fourth additive, the total content of each of the compounds preferably satisfies the range specified above.

[Water-Soluble Polymer]

The polishing agent of the present embodiment may further comprise a water-soluble polymer, for the purpose of adjusting the polishing properties such as flatness, in-plane uniformity, polishing selectivity for silicon oxide with respect to silicon nitride (polishing rate for silicon oxide/polishing rate for silicon nitride), and polishing selectivity for silicon oxide with respect to polysilicon (polishing rate for silicon oxide/polishing rate for polysilicon). The term "water-soluble polymer" is defined as a polymer whose solubility to 100 g of water at 25° C. is at least 0.1 g. The first additive and the second additive are not included in the "water-soluble polymer".

Specific examples of the water-soluble polymer include, but are not particularly limited to, polysaccharides such as alginic acid, pectic acid, carboxymethyl cellulose, agar, curdlan and guar gum; and vinyl-based polymers such as polyvinylpyrrolidone and polyacrolein. The water-soluble polymer can be used as a single type alone or as a combination of two or more types.

When the water-soluble polymer is used, the lower limit of the content of the water-soluble polymer is preferably 0.0001 mass % or more, more preferably 0.001 mass % or more, and further preferably 0.01 mass % or more, based on the total mass of the polishing agent, from the viewpoint of obtaining an addition effect of the water-soluble polymer while suppressing sedimentation of the abrasive grains. The upper limit of the content of the water-soluble polymer is preferably 5 mass % or less, more preferably 1 mass % or less, and further preferably 0.5 mass % or less, based on the total mass of the polishing agent, from the viewpoint of obtaining an addition effect of the water-soluble polymer while suppressing sedimentation of the abrasive grains. From the viewpoints above, the content of the water-soluble polymer is more preferably 0.0001 mass % or more and 5 mass % or less based on the total mass of the polishing agent. When a plurality of compounds are used as the water-soluble polymer, the total content of each of the compounds preferably satisfies the range specified above.

(Fluid Medium)

The fluid medium in the polishing agent of the present embodiment is not particularly limited, but it is preferably water such as deionized water or ultrapure water. An organic solvent having solubility in water of 10 g/100 g ($H_2O$) or more and being in the form of a liquid at 20° C. (excluding the first, second and third additives) may be comprised in the polishing agent. The content of the fluid medium may be the remainder of the polishing agent excluding the content of other constituent components, and it is not particularly limited.

(Properties of Polishing Agent)

The lower limit of the pH of the polishing agent of the present embodiment is preferably 3.0 or more, more preferably 4.0 or more, further preferably 4.5 or more, particularly preferably 5.0 or more, extremely preferably 5.5 or more, and very preferably 6.0 or more, from the viewpoint of further improving the polishing rate for insulating material and further improving flatness. The upper limit of the pH is preferably 10.0 or less, more preferably 9.0 or less, further preferably 8.0 or less, particularly preferably 7.0 or less, and extremely preferably 6.5 or less, from the viewpoint of further improving the polishing rate for insulating material and preventing generation of polishing residue for insulating material. From the viewpoints above, the pH of the polishing agent is more preferably 3.0 or more and 10.0 or less. The pH is defined as pH at a liquid temperature of 25° C.

The pH of the polishing agent can be adjusted with an acid component such as an inorganic acid or an organic acid; an alkaline component such as ammonia, sodium hydroxide, tetramethylammonium hydroxide (TMAH) or imidazole; or the like. A buffering agent may also be added to stabilize the pH. A buffering agent may also be added as a buffer solution (a buffering agent-containing solution). Examples of such buffer solution include an acetate buffer solution and a phthalate buffer solution.

The pH of the polishing agent of the present embodiment can be measured with a pH meter (for example, a Model PHL-40 by DKK Corp.). Specifically, for example, after 2-point calibration of a pH meter using a phthalate pH buffer solution (pH 4.01) and a neutral phosphate pH buffer solution (pH 6.86) as standard buffer solutions, the pH meter electrode is placed in the polishing agent, and then the value is measured after at least 2 min passes for stabilization. At this time, the liquid temperatures of the standard buffer solution and polishing agent are both 25° C.

The polishing agent of the present embodiment may be stored as a one-pack polishing agent comprising at least the abrasive grains, the first additive, the second additive, the third additive and a fluid medium, or it may be stored as a multi-pack (for example, two-pack) polishing agent set comprising constituent components of the polishing agent divided into a slurry (first liquid) and an additive solution (second liquid) so that the slurry and the additive solution are mixed to form the polishing agent. The slurry contains at least the abrasive grains, for example. The additive solution contains at least one selected from the group consisting of the first additive, the second additive and the third additive, for example. Between the slurry and the additive solution, the first additive, the second additive, the third additive, the fourth additive, the water-soluble polymer and the buffering agent are preferably contained in the additive solution. The constituent components of the polishing agent may be stored as a polishing agent set divided into three or more liquids. For example, the constituent components of the polishing agent may be stored separately as a slurry comprising the abrasive grains and a fluid medium, an additive solution containing the first additive and a fluid medium, and an additive solution containing the second additive, the third additive and a fluid medium.

In the polishing agent set, the slurry and the additive solution are mixed immediately before polishing or during polishing to prepare the polishing agent. A one-pack polishing agent may be stored as a polishing agent storage solution with a reduced fluid medium content, and used by dilution with a fluid medium during polishing. A multi-pack polishing agent set may be stored as a slurry storage solution and additive solution storage solution with reduced fluid medium contents, and used by dilution with a fluid medium during polishing.

In the case of a one-pack polishing agent, the method used to supply the polishing agent onto the polishing platen may be a method for supplying the polishing agent by direct liquid conveyance; a method for conveying the polishing agent storage solution and the fluid medium through separate tubes, merging them together and then supplying; or a method for mixing the polishing agent storage solution and the fluid medium beforehand and then supplying.

For storage as a multi-pack polishing agent set separated into a slurry and an additive solution, the polishing rate can be adjusted by optionally varying the composition of these liquids. When a polishing agent set is used for polishing, examples of the method for supplying the polishing agent onto the polishing platen includes the following method. For example, there may be used a method for conveying the slurry and the additive solution through separate tubes and merging the tubes to mix and then supplying; a method for conveying the slurry storage solution, the additive solution storage solution and a fluid medium through separate tubes and merging the tubes to mix and then supplying; a method for mixing the slurry and the additive solution beforehand and then supplying; or a method for mixing the slurry storage solution, the additive solution storage solution and a fluid medium beforehand and then supplying. There may also be used a method in which the slurry and the additive solution of the polishing agent set are each supplied onto the polishing platen. In this case, the polishing agent obtained by mixing the slurry and the additive solution on the polishing platen is used for polishing of the surface to be polished.

(Method for Polishing Base)

The method for polishing a base of the present embodiment may comprise a polishing step of polishing the surface to be polished of a base using the one-pack polishing agent, or it may comprise a polishing step of polishing the surface to be polished of a base using the polishing agent obtained by mixing at least the slurry and the additive solution of the polishing agent set. The method for polishing a base of the present embodiment may be a method for polishing a base having an insulating material and a stopper material, and for example, it may comprise a polishing step of selectively polishing the insulating material with respect to the stopper material using the one-pack polishing agent, or the polishing agent obtained by mixing the slurry and the additive solution of the polishing agent set. In this case, the base may have a member containing the insulating material and a member containing the stopper material (stopper), for example. The stopper material is preferably polysilicon and silicon nitride, and more preferably polysilicon. The phrase "selectively polish material A with respect to material B" means that the polishing rate for material A is higher than the polishing rate for material B under the same polishing conditions. It means, for example, that the material A is polished with the polishing rate ratio of the polishing rate for material A with respect to the polishing rate for material B being 150 or more.

In the polishing step, for example, under the condition that the material to be polished of the base which has the material to be polished is pressed against the polishing pad of a polishing platen, the polishing agent is supplied between the material to be polished and the polishing pad, and the base and the polishing platen are moved relative to each other to polish the surface to be polished of the material to be polished. For example, at least a portion of the material to be polished is removed by the polishing in the polishing step.

Examples of the base which is to be polished include a substrate, and for example, it may be a substrate comprising a material to be polished formed on a substrate for semiconductor element production (for example, a semiconductor substrate in which an STI pattern, gate pattern or wiring pattern has been formed). Examples of the material to be polished include an insulating material such as silicon oxide; and a stopper material such as polysilicon or silicon nitride. The material to be polished may be a single material or a plurality of materials. When a plurality of materials are exposed on the surface to be polished, they may be considered as the material to be polished. The material to be polished may be in the form of a film (film to be polished), such as a silicon oxide film, a polysilicon film and a silicon nitride film.

By polishing a material to be polished (for example, an insulating material such as silicon oxide) formed on such substrate with the polishing agent and removing the unwanted sections, it is possible to eliminate irregularities on the surface of the material to be polished, to produce a smooth surface over the entire surface of the material to be polished. The polishing agent of the present embodiment is preferably used for polishing of a surface to be polished containing silicon oxide.

In the present embodiment, it is possible to polish an insulating material in a base having an insulating material containing silicon oxide on at least the surface, a stopper (polishing stop layer) disposed as the lower layer of the insulating material, and a semiconductor substrate disposed under the stopper. The stopper material composing the stopper is a material with a lower polishing rate than the insulating material, and it is preferably polysilicon, silicon nitride or the like. With such a base, excessive polishing of the insulating material can be prevented by stopping the polishing when the stopper have exposed, and therefore, it is possible to improve flatness of the surface of the base after polishing.

Examples of the forming method for a material to be polished include a CVD method such as a low-pressure CVD method, a sub-atmospheric pressure CVD method and a plasma CVD method; a spin coating method in which a liquid material is coated onto a substrate which is spinning.

Silicon oxide can be obtained using a low-pressure CVD method, for example, by thermal reaction of monosilane ($SiH_4$) and oxygen ($O_2$). Silicon oxide is also obtained using a sub-atmospheric pressure CVD method, for example, by thermal reaction of tetraethoxysilane ($Si(OC_2H_5)_4$) and ozone ($O_3$). As other example, silicon oxide is likewise obtained by plasma reaction of tetraethoxysilane and oxygen.

Silicon oxide can be obtained using a spin coating method, for example, by coating a liquid starting material containing inorganic polysilazane, inorganic siloxane or the like onto a substrate and conducting thermosetting reaction in a furnace body or the like.

Examples of the forming method for polysilicon include a low-pressure CVD method in which monosilane is subjected to thermal reaction, and a plasma CVD method in which monosilane is subjected to plasma reaction.

Examples of the forming method for silicon nitride include a low-pressure CVD method in which dichlorsilane and ammonia are thermally reacted, and a plasma CVD method in which monosilane, ammonia and nitrogen are subjected to plasma reaction. The silicon nitride obtained by such a method may contain elements other than silicon and nitrogen, such as carbon or hydrogen, in order to adjust the material quality.

In order to stabilize the materials such as silicon oxide, polysilicon and silicon nitride which are obtained by such methods, heat treatment may be performed at a temperature of 200° C. to 1000° C. as necessary. The silicon oxide obtained by such methods may also contain small amounts of boron (B), phosphorus (P), carbon (C) or the like in order to increase the embedding property.

Hereinafter, the polishing method of the present embodiment will be described using a polishing method for a semiconductor substrate on which an insulating material has been formed, as an example. In the polishing method of the present embodiment, the polishing apparatus used can be a common polishing apparatus having a holder capable of holding a base, such as a semiconductor substrate, which has the surface to be polished, and a polishing platen on which a polishing pad can be mounted. Rotational speed-variable motors or the like are mounted on the holder and the polishing platen, respectively. The polishing apparatus used can be the polishing apparatus: Reflexion manufactured by Applied Materials, Inc.

The polishing pad used can be a common nonwoven fabric, a foam body, a non-foam body or the like. Material for the polishing pad used can be a resin such as polyurethane, acryl, polyester, an acryl-ester copolymer, polytetrafluoroethylene, polypropylene, polyethylene, poly-4-methylpentene, cellulose, cellulose ester, polyamide (for example, nylon (trademark) and aramid), polyimide, polyimideamide, a polysiloxane copolymer, an oxirane compound, a phenol resin, polystyrene, polycarbonate, or an epoxy resin. Particularly, material for the polishing pad is preferably foamed polyurethane and non-foamed polyurethane, from the viewpoint of a polishing rate and flatness. The polishing pad may be furrowed to allow accumulation of the polishing agent.

The polishing conditions are not limited, but the rotational speed (number of rotations) of the polishing platen is preferably 200 $min^{-1}$ or less so that the semiconductor substrate does not fly out, and the polishing pressure (machining load) on the semiconductor substrate is preferably 100 kPa or less from the viewpoint of sufficiently suppressing the generation of polishing scratches. The polishing agent is preferably continuously supplied to the polishing pad with a pump or the like during polishing. The amount supplied is not limited, but preferably the surface of the polishing pad is covered by the polishing agent at all times.

The semiconductor substrate after polishing is preferably sufficiently washed in flowing water to remove the particles adhering to the substrate. The washing may be performed using dilute hydrofluoric acid or ammonia water in addition to purified water, and a brush may be used to increase the washing efficiency. It is preferable that, after washing, the water droplets adhering to the semiconductor substrate are removed off using a spin dryer or the like, and then the semiconductor substrate is dried.

The polishing agent, polishing agent set and polishing method of the present embodiment can be suitably used for formation of an STI. For formation of an STI, the lower limit of the polishing rate ratio for the insulating material (for example, silicon oxide) with respect to the stopper material (for example, polysilicon) is preferably 150 or more, more preferably 250 or more, further preferably 350 or more, particularly preferably 500 or more, and extremely preferably 700 or more. If the polishing rate ratio is lower than 150, the magnitude of the polishing rate for insulating material with respect to the polishing rate for stopper material is small, and therefore, it will tend to be difficult to halt polishing at the prescribed location during formation of the STI. If the polishing rate ratio is 150 or more, on the other hand, it will be easier to halt polishing, which is more suitable for STI formation.

The polishing agent, polishing agent set and polishing method of the present embodiment can also be used for polishing of pre-metal insulating materials. Examples of the pre-metal insulating materials include phosphorus-silicate glass and boron-phosphorus-silicate glass in addition to silicon oxide, as well as silicon oxyfluoride and fluorinated amorphous carbon.

The polishing agent, polishing agent set and polishing method of the present embodiment can also be applied for materials other than insulating materials such as silicon oxide. Examples of such materials include high permittivity materials such as Hf-based, Ti-based and Ta-based oxides; semiconductor materials such as silicon, amorphous silicon, SiC, SiGe, Ge, GaN, GaP, GaAs and organic semiconductors; phase-change materials such as GeSbTe; inorganic conductive materials such as ITO; and polymer resin materials such as polyimide-based, polybenzooxazole-based, acrylic, epoxy-based and phenol-based materials.

The polishing agent, polishing agent set and polishing method of the present embodiment can be applied not only for polishing of film-like materials, but also for various types of substrates made of glass, silicon, SiC, SiGe, Ge, GaN, GaP, GaAs, sapphire, plastics or the like.

The polishing agent, polishing agent set and polishing method of the present embodiment can be used not only for production of semiconductor elements, but also for production of image display devices such as TETs and organic ELs; optical parts such as photomasks, lenses, prisms, optical fibers and single crystal scintillators; optical elements such as optical switching elements and optical waveguides; lightemitting elements such as solid lasers and blue laser LEDs; and magnetic storage devices such as magnetic disks and magnetic heads.

EXAMPLES

Hereinafter, the present invention will be specifically described with reference to Examples, with the understanding that the invention is not limited thereto.

<Synthesis of Hydroxide of Tetravalent Metal Element>

After 4.968 L of water was charged in a container, 0.143 L of a cerium ammonium nitrate aqueous solution having a concentration of 50 mass % (general formula $Ce(NH_4)_2(NO_3)_6$, formula weight 548.2 g/mol, manufactured by NIHON KAGAKU SANGYO CO., LTD., product name 50% CAN liquid) was added and mixed. Then, the liquid temperature was adjusted to 40° C. to obtain a metal salt aqueous solution (metal salt concentration: 0.037 mol/L).

Next, imidazole was dissolved in water to prepare 0.912 L of an aqueous solution having a concentration of 0.7 mol/L. Then, the liquid temperature was adjusted to a temperature of 40° C. to obtain an alkali liquid.

The container containing the above-described metal salt aqueous solution therein was placed in a water tank filled with water. The water temperature of the water tank was adjusted to 40° C. using an external-circulating device Coolnics Circulator (manufactured by Tokyo Rikakikai Co., Ltd. (EYELA), product name Cooling Thermopump CTP101). The above-described alkali liquid was added into the container at a mixing rate of $1.7 \times 10^{-6}$ m³/min while maintaining the water temperature at 40° C. and stirring the metal salt aqueous solution at a stirring rate of 400 min⁻¹, to obtain a slurry precursor 1 comprising abrasive grains including a hydroxide of tetravalent cerium. The metal salt aqueous solution was stirred using a 3-bladed pitched paddle having a total blade length of 5 cm.

The obtained slurry precursor 1 was subjected to ultrafiltration while being circulated, using a hollow fiber filter having a cutoff molecular weight of 50000 to remove ion components until the conductivity became 50 mS/m or less, and therefore, a slurry precursor 2 was obtained. The above-described ultrafiltration was performed while adding water so as to maintain a constant water level of a tank containing the slurry precursor 1, using a fluid level sensor. The content of non-volatile component (the content of the abrasive grains including a hydroxide of tetravalent cerium) of the slurry precursor 2 was calculated by taking a proper amount of the obtained slurry precursor 2 and measuring the mass before and after drying. If the content of the non-volatile component was less than 1.0 mass % at this stage, ultrafiltration was further performed such that it was concentrated to about more than 1.1 mass %. Finally, a proper amount of water was added to prepare a cerium hydroxide slurry storage solution (particle content: 1.0 mass %).

<Structural Analysis of Abrasive Grains>

A suitable amount of the cerium hydroxide slurry storage solution was taken and vacuum dried to isolate the abrasive grains, and then, washing was sufficiently performed with purified water to obtain a sample. The obtained sample was measured by FT-IR ATR method, and a peak for nitrate ion ($NO_3^-$) was observed in addition to a peak for hydroxide ion (OFF). The same sample was measured by XPS for nitrogen (N-XPS), and a peak for nitrate ion was observed while no peak for $NH^{4+}$ was observed. These results confirmed that the abrasive grains comprised in the cerium hydroxide slurry storage solution at least partially contain particles thought to have a nitrate ion bonded to a cerium element.

<Measurement of Absorbance and Light Transmittance>

A suitable amount of the cerium hydroxide slurry storage solution was taken and diluted with water so that an abrasive grain content was adjusted to 0.0065 mass % (65 ppm), to obtain a measuring sample (aqueous dispersion). Approximately 4 mL of this measuring sample was placed in a 1 cm-square cell, and the cell was set in a spectrophotometer (apparatus name: U3310) manufactured by Hitachi, Ltd. Spectrophotometry was performed in a wavelength range of 200 to 600 nm to measure the absorbance for light having a wavelength of 290 nm and the absorbance for light having a wavelength of 450 to 600 nm. The absorbance for light having a wavelength of 290 nm was 1.207, and the absorbance for light having a wavelength of 450 to 600 nm was less than 0.010.

Approximately 4 mL of the cerium hydroxide slurry storage solution (particle content: 1.0 mass %) was placed in a 1 cm-square cell, and the cell was set in a spectrophotometer (apparatus name: U3310) manufactured by Hitachi, Ltd. Spectrophotometry was performed in a wavelength range of 200 to 600 nm to measure the absorbance for light having a wavelength of 400 nm and the light transmittance for light having a wavelength of 500 nm. The absorbance for light having a wavelength of 400 nm was 2.25, and the light transmittance for light having a wavelength of 500 nm was 99%/cm.

<Measurement of Content of Non-Volatile Component in Liquid Phase>

A centrifuge tube (tube) included in an ultracentrifuge (device name: 70P-72) manufactured by Hitachi Koki Co., Ltd., was filled with the cerium hydroxide slurry storage solution (particle content: 1.0 mass %), and the ultracentrifuge was used for 50 minutes of centrifugation at a rotational speed of 50000 min⁻¹. A precipitate was confirmed in the bottom of the centrifuge tube. In the ultracentrifuge, the tube angle was 26°; the minimum radius $R_{min}$ was 3.53 cm; the maximum radius $R_{max}$ was 7.83 cm; and the average radius $R_{av}$ was 5.68 cm. The centrifugal acceleration calculated from average radius $R_{av}$ was 158756 G=$1.59 \times 10^5$ G. 5.0 g of the liquid phase was sampled from the centrifuge tube after centrifugal separation, and placed in an aluminum dish, and dried at 150° C. for 1 hour. The content of non-volatile component (the content of the cerium hydroxide particles) contained in the liquid phase was calculated by measuring the mass before and after drying. The content of non-volatile component was 812 ppm.

<Preparation of CMP Polishing Agent>

Example 1

A CMP polishing agent comprising 0.05 mass % of cerium hydroxide particles, 0.5 mass % of polyethylene glycol, 0.001 mass % of polyallylamin, and 0.001 mass % (10 ppm) of sulfanilic acid was prepared by mixing 100 g of an additive solution storage solution containing 5 mass % of polyethylene glycol [PEG#400 manufactured by Lion Corp., weight-average molecular weight: 400] and 95 mass % of water, 50 g of a cerium hydroxide slurry storage solution, 830 g of water, 10 g of an aqueous solution containing 0.1 mass % of polyallylamine [PAA-01 manufactured by Nittobo Medical Co., Ltd., weight-average molecular weight: $1.6 \times 10^3$] as a cationic polymer, and 10 g of an aqueous solution containing 0.1 mass % of sulfanilic acid as an amino group-containing sulfonic acid compound. The pH of the CMP polishing agent was adequately adjusted to 6.1 using imidazole.

Example 2

A CMP polishing agent comprising 0.05 mass % of cerium hydroxide particles, 0.5 mass % of polyethylene glycol, 0.001 mass % of polyallylamine, and 0.005 mass % (50 ppm) of sulfanilic acid was prepared in the same manner as Example 1, except for the sulfanilic acid content. The pH of the CMP polishing agent was adequately adjusted to 6.2 using imidazole.

Example 3

A CMP polishing agent comprising 0.05 mass % of cerium hydroxide particles, 0.5 mass % of polyethylene glycol, 0.001 mass % of polyallylamine, and 0.01 mass % (100 ppm) of sulfanilic acid was prepared in the same manner as Example 1, except for the sulfanilic acid content. The pH of the CMP polishing agent was adequately adjusted to 6.4 using imidazole.

Example 4

A CMP polishing agent comprising 0.05 mass % of cerium hydroxide particles, 0.5 mass % of polyethylene glycol, 0.003 mass % of a diallyldimethylammonium chloride/acrylamide copolymer, and 0.005 mass % (50 ppm) of sulfanilic acid was prepared by mixing 100 g of an additive solution storage solution containing 5 mass % of polyethylene glycol [PEG#4000 manufactured by Lion Corp., weight-average molecular weight: $4.0 \times 10^3$] and 95 mass % of water, 50 g of a cerium hydroxide slurry storage solution, 770 g of water, 30 g of an aqueous solution containing 0.1 mass % of a diallyldimethylammonium chloride/acrylamide copolymer [PAS-J-81 manufactured by Nittobo Medical Co., Ltd., weight-average molecular weight: $200 \times 10^3$] as a cationic polymer, and 50 g of an aqueous solution containing 0.1 mass % of sulfanilic acid as an amino group-containing sulfonic acid compound. The pH of the CMP polishing agent was adequately adjusted to 6.0 using imidazole.

Example 5

A CMP polishing agent comprising 0.05 mass % of cerium hydroxide particles, 0.5 mass % of polyethylene glycol, 0.003 mass % of a diallyldimethylammonium chloride/acrylamide copolymer, and 0.005 mass % (50 ppm) of sulfanilic acid was prepared by mixing 100 g of an additive solution storage solution containing 5 mass % of polyethylene glycol [PEG#600 manufactured by Lion Corp., weight-average molecular weight: 600] and 95 mass % of water, 50 g of a cerium hydroxide slurry storage solution, 770 g of water, 30 g of an aqueous solution containing 0.1 mass % of a diallyldimethylammonium chloride/acrylamide copolymer [PAS-J-81 manufactured by Nittobo Medical Co., Ltd., weight-average molecular weight: $200 \times 10^3$] as a cationic polymer, and 50 g of an aqueous solution containing 0.1 mass % of sulfanilic acid as an amino group-containing sulfonic acid compound. The pH of the CMP polishing agent was adequately adjusted to 6.0 using imidazole.

Example 6

A CMP polishing agent comprising 0.05 mass % of cerium hydroxide particles, 0.5 mass % of polyethylene glycol, 0.003 mass % of polyethyleneimine [EPOMIN P-1000 manufactured by Nippon Shokubai Co., Ltd., weight-average molecular weight: $70 \times 10^3$], and 0.005 mass % (50 ppm) of sulfanilic acid was prepared in the same manner as Example 5, except for the type of the cationic polymer. The pH of the CMP polishing agent was adequately adjusted to 6.0 using imidazole.

Example 7

A CMP polishing agent comprising 0.05 mass % of cerium hydroxide particles, 0.5 mass % of polyethylene glycol, 0.003 mass % of a diallyldimethylammonium chloride/acrylamide copolymer [PAS-J-81 manufactured by Nittobo Medical Co., Ltd., weight-average molecular weight: $200 \times 10^3$], and 0.005 mass % (50 ppm) of 2-aminoethanesulfonic acid was prepared in the same manner as Example 5, except for the type of the amino group-containing sulfonic acid compound. The pH of the CMP polishing agent was adequately adjusted to 6.1 using imidazole.

Example 8

A CMP polishing agent comprising 0.05 mass % of cerium hydroxide particles, 0.5 mass % of polyglycerin, 0.003 mass % of a diallyldimethylammonium chloride/acrylamide copolymer, and 0.005 mass % (50 ppm) of sulfanilic acid was prepared by mixing 100 g of an additive solution storage solution containing 5 mass % of a polyglycerin decamer (PGL decamer) [PGL750 manufacture by Sakamoto Yakuhin Kogyo Co., Ltd., weight-average molecular weight: 750] and 95 mass % of water, 50 g of a cerium hydroxide slurry storage solution, 770 g of water, 30 g of an aqueous solution containing 0.1 mass % of a diallyldimethylammonium chloride/acrylamide copolymer [PAS-J-81 manufactured by Nittobo Medical Co., Ltd., weight-average molecular weight: $200 \times 10^3$] as a cationic polymer, and 50 g of an aqueous solution containing 0.1 mass % of sulfanilic acid as an amino group-containing sulfonic acid compound. The pH of the CMP polishing agent was adequately adjusted to 6.0 using imidazole.

Example 9

A CMP polishing agent comprising 0.05 mass % of cerium hydroxide particles, 0.5 mass % of a vinyl alcohol polymer, 0.003 mass % of a diallyldimethylammonium chloride/acrylamide copolymer, and 0.005 mass % (50 ppm) of sulfanilic acid was prepared by mixing 100 g of an additive solution storage solution containing 5 mass % of a vinyl alcohol polymer [PVA-403 by Kuraray Co., Ltd., mean polymerization degree: 300, saponification degree: 80 mol %, weight-average molecular weight: $14 \times 10^3$] and 95 mass % of water, 50 g of a cerium hydroxide slurry storage solution, 770 g of water, 30 g of an aqueous solution containing 0.1 mass % of a diallyldimethylammonium chloride/acrylamide copolymer [PAS-J-81 manufactured by Nittobo Medical Co., Ltd., weight-average molecular weight: $200 \times 10^3$] as a cationic polymer, and 50 g of an aqueous solution containing 0.1 mass % of sulfanilic acid as an amino group-containing sulfonic acid compound. The pH of the CMP polishing agent was adequately adjusted to 6.3 using imidazole.

Example 10

A CMP polishing agent comprising 0.05 mass % of cerium hydroxide particles, 0.5 mass % of polyoxyethylene styrenated phenyl ether, 0.003 mass % of a diallyldimethylammonium chloride/acrylamide copolymer, and 0.005 mass % (50 ppm) of sulfanilic acid was prepared by mixing 100 g of an additive solution storage solution containing 5 mass % of polyoxyethylene styrenated phenyl ether [NOIGEN EA-137 manufactured by Dai-Ichi Kogyo Seiyaku Co., Ltd., weight-average molecular weight: 700] and 95 mass % of water, 50 g of a cerium hydroxide slurry storage solution, 770 g of water, 30 g of an aqueous solution containing 0.1 mass % of a diallyldimethylammonium chloride/acrylamide copolymer [PAS-J-81 manufactured by Nittobo Medical Co., Ltd., weight-average molecular weight: $200 \times 10^3$] as a cationic polymer, and 50 g of an aqueous solution containing 0.1 mass % of sulfanilic acid as an amino group-containing sulfonic acid compound. The pH of the CMP polishing agent was adequately adjusted to 6.1 using imidazole.

Example 11

A CMP polishing agent comprising 0.05 mass % of cerium hydroxide particles, 0.5 mass % of polyoxyethylene styrenated phenyl ether, 0.003 mass % of a diallyldimethylammonium chloride/acrylamide copolymer, and 0.01 mass % (100 ppm) of 2,4-diaminobenzensulfonic acid was prepared by mixing 100 g of an additive solution storage solution containing 5 mass % of polyoxyethylene styrenated phenyl ether [NOIGEN EA-207D manufactured by Dai-Ichi Kogyo Seiyaku Co., Ltd., weight-average molecular weight: 4500] and 95 mass % of water, 50 g of a cerium hydroxide slurry storage solution, 720 g of water, 30 g of an aqueous solution containing 0.1 mass % of a diallyldimethylammonium chloride/acrylamide copolymer [PAS-J-81 manufactured by Nittobo Medical Co., Ltd., weight-average molecular weight: $200 \times 10^3$] as a cationic polymer, and 100 g of an aqueous solution containing 0.1 mass % of 2,4-diaminobenzensulfonic acid as an amino group-containing sulfonic acid compound. The pH of the CMP polishing agent was adequately adjusted to 6.1 using imidazole.

Example 12

A CMP polishing agent comprising 0.05 mass % of cerium hydroxide particles, 0.5 mass % of polypropylene glycol, 0.003 mass % of a diallyldimethylammonium chloride/acrylamide copolymer, and 0.003 mass % (30 ppm) of sulfanilic acid was prepared by mixing 100 g of an additive solution storage solution containing 5 mass % of polypropylene glycol [UNIOR D-700 manufactured by NOF Corporation, weight-average molecular weight: 700] and 95 mass % of water, 50 g of a cerium hydroxide slurry storage solution, 790 g of water, 30 g of an aqueous solution containing 0.1 mass % of a diallyldimethylammonium chloride/acrylamide copolymer [PAS-J-81 manufactured by Nittobo Medical Co., Ltd., weight-average molecular weight: $200 \times 10^3$] as a cationic polymer, and 30 g of an aqueous solution containing 0.1 mass % of sulfanilic acid as an amino group-containing sulfonic acid compound. The pH of the CMP polishing agent was adequately adjusted to 6.0 using imidazole.

Comparative Example 1

A CMP polishing agent with a pH of 5.9 containing 0.05 mass % of cerium hydroxide particles was prepared by mixing 50 g of a cerium hydroxide slurry storage solution, 940 g of water, and 10 g of an aqueous solution of 1 mass % imidazole.

Comparative Example 2

A CMP polishing agent comprising 0.05 mass % of cerium hydroxide particles and 0.001 mass % of polyallylamine was prepared by mixing 50 g of a cerium hydroxide slurry storage solution, 940 g of water, and 10 g of an aqueous solution of 0.1 mass % of polyallylamine [PAA-01 manufactured by Nittobo Medical Co., Ltd., weight-average molecular weight: $1.6 \times 10^3$]. The pH of the CMP polishing agent was adequately adjusted to 6.0 using imidazole.

Comparative Example 3

A CMP polishing agent comprising 0.05 mass % of cerium hydroxide particles and 0.5 mass % of polyethylene glycol was prepared by mixing 100 g of an additive solution storage solution containing 5 mass % of polyethylene glycol [PEG#600 manufactured by Lion Corp., weight-average molecular weight: 600] and 95 mass % of water, 50 g of a cerium hydroxide slurry storage solution, and 850 g of water. The pH of the CMP polishing agent was adequately adjusted to 6.2 using imidazole.

Comparative Example 4

A CMP polishing agent comprising 0.05 mass % of cerium hydroxide particles and 0.5 mass % of a vinyl alcohol polymer was prepared by mixing 100 g of an additive solution storage solution containing 5 mass % of a vinyl alcohol polymer [PVA-403 manufactured by Kuraray Co., Ltd., mean polymerization degree: 300, saponification degree: 80 mol %, weight-average molecular weight: $14 \times 10^3$] and 95 mass % of water, 50 g of a cerium hydroxide slurry storage solution, and 850 g of water. The pH of the CMP polishing agent was adequately adjusted to 5.8 using imidazole.

Comparative Example 5

A CMP polishing agent comprising 0.05 mass % of cerium hydroxide particles, 0.5 mass % of a vinyl alcohol polymer, and 0.0001 mass % of polyallylamine was prepared in the same manner as Comparative Example 4, except that polyallylamine [PAA-01 manufactured by Nittobo Medical Co., Ltd., weight-average molecular weight: $1.6 \times 10^3$] was added as a cationic polymer. The pH of the CMP polishing agent was adequately adjusted to 5.9 using imidazole.

Comparative Example 6

A CMP polishing agent comprising 0.05 mass % of cerium hydroxide particles, 1 mass % of a vinyl alcohol polymer, and 0.0008 mass % of polyallylamine was prepared by mixing 100 g of an additive solution storage solution containing 10 mass % of a vinyl alcohol polymer [PVA-403 by Kuraray Co., Ltd., mean polymerization degree: 300, saponification degree: 80 mol %, weight-average molecular weight: $14 \times 10^3$], 0.008 mass % of polyallylamine [PAA-08 by Nittobo Medical Co., Ltd., weight-average molecular weight: $8.0 \times 10^3$], and 89.992 mass % of water, 50 g of a cerium hydroxide slurry storage solution, and 850 g of water. The pH of the CMP polishing agent was adequately adjusted to 6.0 using imidazole.

Comparative Example 7

A CMP polishing agent comprising 0.05 mass % of cerium hydroxide particles, 0.007 mass % of polyethylene glycol, and 0.015 mass % of chitosan was prepared by mixing 100 g of an additive solution storage solution containing 0.07 mass % of polyethylene glycol [PEG#600 manufactured by Lion Corp., weight-average molecular weight: 600], 0.15 mass % of chitosan [DAICHITOSAN 100D manufactured by Dainichiseika Color & Chemicals Mfg. Co., Ltd., deacetylation degree: ≥98%], and 99.78 mass % of water, 50 g of a cerium hydroxide slurry storage solution, and 850 g of water. The pH of the CMP polishing agent was adequately adjusted to 6.4 using imidazole.

Comparative Example 8

A CMP polishing agent comprising 0.05 mass % of cerium hydroxide particles, 0.5 mass % of a vinyl alcohol polymer, and 0.001 mass % of a N,N-dimethylaminopropylacrylamide polymer was prepared by mixing 100 g of an additive solution storage solution containing 5 mass % of a vinyl alcohol polymer [PVA-403 manufactured by Kuraray Co., Ltd., mean polymerization degree: 300, saponification degree: 80 mol %, weight-average molecular weight: $14 \times 10^3$], 0.01 mass % of a N,N-dimethylaminopropylacrylamide polymer [weight-average molecular weight: $23 \times 10^3$], and 94.99 mass % of water, 50 g of a cerium hydroxide slurry storage solution, and 850 g of water. The pH of the CMP polishing agent was adequately adjusted to 6.1 using imidazole.

The N,N-dimethylaminopropylacrylamide polymer was prepared by the following procedure. First, 15 g of N,N-dimethylaminopropylacrylamide (DMAPAA manufactured by Kohjin Co., Ltd.) and 281 g of water were placed in a round bottom flask and nitrogen gas was introduced in. An aqueous solution composed of 696 mg of 2,2'-azobis(2-methylpropionamidine)dihydrochloride and 4 g of water was added while heating at 80° C. and stirring. After heating and stirring at 80° C. for 2 hours, it was cooled to room temperature (25° C.) to obtain a N,N-dimethylaminopropylacrylamide polymer with a concentration of 5 mass %.

Comparative Example 9

A CMP polishing agent comprising 0.05 mass % of cerium hydroxide particles and 0.005 mass % (50 ppm) of sulfanilic acid was prepared by mixing 50 g of a cerium hydroxide slurry storage solution, 900 g of water, and 50 g of an aqueous solution containing 0.1 mass % of sulfanilic acid as an amino group-containing sulfonic acid compound. The pH of the CMP polishing agent was adequately adjusted to 6.1 using imidazole.

Comparative Example 10

A CMP polishing agent comprising 0.05 mass % of cerium hydroxide particles, 0.5 mass % of polyethylene glycol, and 0.005 mass % (50 ppm) of sulfanilic acid was prepared by mixing 100 g of an additive solution storage solution containing 5 mass % of polyethylene glycol [PEG#600 manufactured by Lion Corp., weight-average molecular weight: 600] and 95 mass % of water, 50 g of a cerium hydroxide slurry storage solution, 800 g of water, and 50 g of an aqueous solution containing 0.1 mass % of sulfanilic acid as an amino group-containing sulfonic acid compound. The pH of the CMP polishing agent was adequately adjusted to 6.1 using imidazole.

Comparative Example 11

A CMP polishing agent comprising 0.05 mass % of cerium hydroxide particles, 0.001 mass % of polyallylamine, and 0.005 mass % (50 ppm) of sulfanilic acid was prepared by mixing 50 g of a cerium hydroxide slurry storage solution, 890 g of water, 10 g of an aqueous solution containing 0.1 mass % of polyallylamine [PAA-01 manufactured by Nittobo Medical Co., Ltd., weight-average molecular weight: $1.6 \times 10^3$] as a cationic polymer, and 50 g of an aqueous solution containing 0.1 mass % of sulfanilic acid as an amino group-containing sulfonic acid compound. The pH of the CMP polishing agent was adequately adjusted to 6.2 using imidazole.

<Evaluation of Liquid Properties>

The pH of the CMP polishing agent and the average particle diameter of the cerium hydroxide particles in the cerium hydroxide slurry storage solution were evaluated under the following conditions.

(pH)

Measuring temperature: 25±5° C.

Measuring apparatus: Model PHL-40 manufactured by DKK Corp.

Measuring method: After 2-point calibration using a standard buffer solution (phthalate pH buffer solution: pH: 4.01 (25° C.), neutral phosphate pH buffer solution: pH 6.86 (25° C.)), the electrode was placed in the CMP polishing agent, and then the pH was measured with the measuring apparatus described above after at least 2 min passed for stabilization.

(Average Particle Diameter of Cerium Hydroxide Particles)

The average particle diameter of the cerium hydroxide particles in the cerium hydroxide slurry storage solution was measured using N5 (trade name) manufactured by Beckman Coulter, Inc. The measuring method was as follows. First, an aqueous dispersion having an abrasive grain content adjusted to 0.2 mass % was prepared, and approximately 1 mL of the aqueous dispersion was placed in a 1 cm-square cell and the cell was set in the N5. Measurement was performed at 25° C. with the refractive index of the dispersion medium set to 1.333 and the viscosity of the dispersion medium set to 0.887 mPa·s, and the value indicated as Unimodal Size Mean was read off. As a result, the average particle diameter of the abrasive grains was 24 nm.

<CMP Evaluation>

The CMP polishing agent was used for polishing of substrates to be polished, under the following polishing conditions. For Comparative Examples 1, 2, 9, and 11, the pattern wafer was not polished since the polishing rate ratio between a silicon oxide film and a polysilicon film was 10 or less, as a result of primary screening in non-pattern wafers.

(CMP Polishing Conditions)

Polishing apparatus: Reflexion (Applied Materials, Inc.)

CMP polishing agent flow rate: 200 mL/min

Substrates to be polished:

(Non-Pattern Wafers)

As blanket wafers without formation of a pattern, there were used a substrate having a 1 μm-thick silicon oxide film formed on a silicon substrate by plasma CVD method, and a substrate having a 0.2 μm-thick polysilicon film formed on a silicon substrate by CVD method.

(Pattern Wafers)

As a pattern wafer with a test pattern formed thereon, there was used a wafer (trade name: 764 wafer, diameter: 300 mm) manufactured by Sematech. The pattern wafer was a wafer obtained through the following steps:

(1) laminating a polysilicon film as a stopper on a silicon substrate;

(2) forming a trench; and (3) laminating a silicon oxide film ($SiO_2$ film) as an insulating material on the silicon substrate and polysilicon film so as to fill in the polysilicon film and the trench.

The silicon oxide film was formed by an HDP (High Density Plasma) method.

Polishing pad: Foamed polyurethane resin with closed cells (Model No. IC1010 manufactured by Rohm & Haas, Japan), Shore D hardness: 60
Polishing pressure: 16.5 kPa (2.4 psi)
Relative speed between substrate and polishing platen: 85 m/min
Polishing time: The blanket wafer was polished for 1 min. The pattern wafer was polished until the polysilicon stopper film as the stopper was exposed. The degree of progression of dishing was confirmed by further shaving for a time equal to the polishing time until the polysilicon film was exposed.
Washing: CMP treatment was followed by washing with ultrasonic water and drying with a spin dryer.

The pattern wafer used was one having sections with line (convex part) & space (concave part) widths of a 200 μm pitch and with a convex part pattern density of 50%. The line & space is a test pattern, and it is a pattern comprising active sections masked by the polysilicon film as the convex parts and trench sections with grooves as the concave parts, alternately arranged. "200 μm pitch for line & space and a convex part pattern density of 50%" means a pattern with alternating arrangement of convex part width: 100 μm and concave part width: 100 μm.

Figure 2:
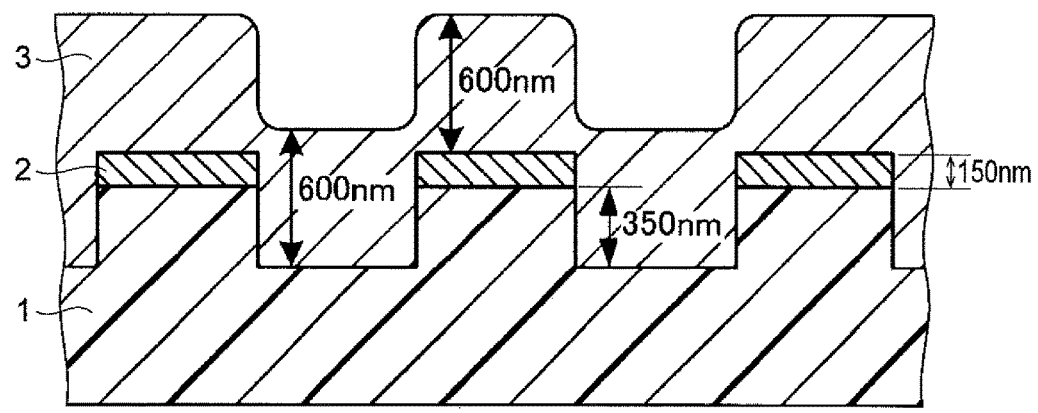
FIG. 2 is a schematic cross-sectional view showing a pattern wafer used in Examples.

In the pattern wafer, the thickness of the silicon oxide film was 600 nm on both the silicon substrate at the concave parts and the polysilicon film at the convex parts. Specifically, as shown in FIG. 2, the thickness of the polysilicon film 2 on the silicon substrate 1 was 150 nm, the thickness of the convex parts of the silicon oxide film 3 was 600 nm, the thickness of the concave parts of the silicon oxide film 3 was 600 nm, and the depth of the concave parts of the silicon oxide film 3 was 500 nm (trench depth: 350 nm+polysilicon film thickness: 150 nm).

For evaluation of polishing of the pattern wafer, the wafer used was one having a remaining step height of 100 nm or less, obtained by polishing the wafer above using a known CMP polishing agent with a self-stopping property (property in which polishing rate is lowered when the remaining step height of the test pattern is small). Specifically, the wafer used was one obtained by polishing using the polishing agent comprising HS-8005-D4 manufactured by Hitachi Chemical Co., Ltd., HS-7303GP manufactured by Hitachi Chemical Co., Ltd. and water in a proportion of 2:1.2:6.8 until the thickness of the silicon oxide film reached 130 nm at the convex parts of a 1000 μm pitch and 50% density pattern.

<Evaluation of Polished Products>
[Polishing Rate for Blanket Wafer]

The polishing rates for films to be polished (silicon oxide film and polysilicon film) which had been polished and washed under the conditions described above (polishing rate for silicon oxide: $SiO_2RR$, polishing rate for polysilicon: p-SiRR) were determined by the following formula. The polishing rate ratio of the $SiO_2RR$ with respect to the p-SiRR was calculated. The difference in film thickness of the film to be polished before and after polishing was determined using a light-interference film thickness meter (trade name: F80 manufactured by Filmetrics Japan, Inc.).

(Polishing rate: RR)=(Film thickness difference of film to be polished before and after polishing (nm))/(polishing time (min))

[Evaluation of Pattern Wafer]

The residual film thickness of the polysilicon film at the convex parts of the pattern wafer which had been polished and washed under the conditions described above and the residual film thickness of the silicon oxide film at the concave parts were measured and the remaining step height (dishing) was determined by the following formula. A dishing progression rate (nm/min) was calculated based on the polishing time (min). The film thickness of the film to be polished before and after polishing was determined using a light-interference film thickness meter (trade name: Nanospec AFT-5100 manufactured by Nanometrics, Inc.).

Remaining step height (dishing)=(350 nm+thickness of polysilicon film (nm)−(residual film thickness of silicon oxide film at concave parts (nm))

[Evaluation of Polishing Scratches]

A substrate to be polished (blanket wafer substrate having a silicon oxide film) which had been polished and washed under the conditions described above was dipped for 15 seconds in an aqueous solution of 0.5 mass % hydrogen fluoride and washed with water for 60 seconds. Next, the surface of the substrate to be polished was washed for 1 min using a polyvinyl alcohol brush while supplying water, and was dried. Complus manufactured by Applied Materials, Inc. was used to detect defects of 0.2 pan or more on the surface of the substrate to be polished. Furthermore, upon observation of the surface of the substrate to be polished using the defect detection coordinates obtained by the Complus manufactured by Applied Materials, Inc., and using an SEM Vision manufactured by Applied Materials, Inc., the number of extracted polishing scratches of 0.2 μm or more at the surface of the substrate to be polished was counted. The number of polishing scratches was about 0 to 3 (per wafer) in both Examples and Comparative Examples, indicating that generation of polishing scratches was sufficiently suppressed.

The measurement results obtained in Examples 1 to 12 and Comparative Examples 1 to 11 are shown in Tables 1 to 4.

TABLE 1

| | | Example 1 | Example 2 | Example 3 | Example 4 | Example 5 | Example 6 |
|---|---|---|---|---|---|---|---|
| Abrasive grains | Kind | Hydroxide of cerium | Hydroxide of cerium | Hydroxide of cerium | Hydroxide of cerium | Hydroxide of cerium | Hydroxide of cerium |
| | Content (mass %) | 0.05 | 0.05 | 0.05 | 0.05 | 0.05 | 0.05 |
| Composition | First additive | PEG#400 | PEG#400 | PEG#400 | PEG#4000 | PEG#600 | PEG#600 |
| | Content (mass %) | 0.5 | 0.5 | 0.5 | 0.5 | 0.5 | 0.5 |
| | Second additive | PAA-01 | PAA-01 | PAA-01 | PAS-J-81 | PAS-J-81 | EPOMIN P-1000 |
| | Content (mass %) | 0.001 | 0.001 | 0.001 | 0.003 | 0.003 | 0.003 |
| | Third additive | Sulfanilic acid | Sulfanilic acid | Sulfanilic acid | Sulfanilic acid | Sulfanilic acid | Sulfanilic acid |
| | Content (mass %) | 0.001 | 0.005 | 0.01 | 0.005 | 0.005 | 0.005 |
| | pH | 6.1 | 6.2 | 6.4 | 6.0 | 6.0 | 6.0 |

TABLE 1-continued

|  |  | Example 1 | Example 2 | Example 3 | Example 4 | Example 5 | Example 6 |
|---|---|---|---|---|---|---|---|
| Polishing rate | $SiO_2RR$ (nm/min) | 295 | 298 | 293 | 323 | 361 | 430 |
|  | p-SiRR (nm/min) | 0.2 | 0.3 | 0.2 | 0.2 | 0.2 | 0.2 |
|  | Polishing rate ratio | 1475 | 993 | 1465 | 1615 | 1805 | 2150 |
| Flatness | Dishing progression rate (nm/min) | 8 | 4 | 2 | 3 | 4 | 3 |
| Polishing scratches (per wafer) |  | 0 | 0 | 1 | 0 | 0 | 2 |

TABLE 2

|  |  | Example 7 | Example 8 | Example 9 | Example 10 | Example 11 | Example 12 |
|---|---|---|---|---|---|---|---|
| Abrasive grains | Kind | Hydroxide of cerium | Hydroxide of cerium | Hydroxide of cerium | Hydroxide of cerium | Hydroxide of cerium | Hydroxide of cerium |
|  | Content (mass %) | 0.05 | 0.05 | 0.05 | 0.05 | 0.05 | 0.05 |
| Composition | First additive | PEG#600 | PGL decamer | PVA-403 | NOIGEN EA-137 | NOIGEN EA-207D | UNIOR D-700 |
|  | Content (mass %) | 0.5 | 0.5 | 0.5 | 0.5 | 0.5 | 0.5 |
|  | Second additive | PAS-J-81 | PAS-J-81 | PAS-J-81 | PAS-J-81 | PAS-J-81 | PAS-J-81 |
|  | Content (mass %) | 0.003 | 0.003 | 0.003 | 0.003 | 0.003 | 0.003 |
|  | Third additive | 2-aminoethane sulfonic acid | Sulfanilic acid | Sulfanilic acid | Sulfanilic acid | 2,4-diamino benzene sulfonic acid | Sulfanilic acid |
|  | Content (mass %) | 0.005 | 0.005 | 0.005 | 0.005 | 0.01 | 0.003 |
|  | pH | 6.1 | 6.0 | 6.3 | 6.1 | 6.1 | 6.0 |
| Polishing rate | $SiO_2RR$ (nm/min) | 302 | 320 | 210 | 290 | 315 | 224 |
|  | p-SiRR (nm/min) | 0.3 | 0.1 | 0.3 | 0.2 | 0.4 | 0.2 |
|  | Polishing rate ratio | 1007 | 3200 | 700 | 1450 | 788 | 1120 |
| Flatness | Dishing progression rate (nm/min) | 6 | 7 | 5 | 7 | 7 | 8 |
| Polishing scratches (per wafer) |  | 1 | 0 | 1 | 0 | 1 | 0 |

TABLE 3

|  |  | Comparative Example 1 | Comparative Example 2 | Comparative Example 3 | Comparative Example 4 | Comparative Example 5 | Comparative Example 6 |
|---|---|---|---|---|---|---|---|
| Abrasive grains | Kind | Hydroxide of cerium | Hydroxide of cerium | Hydroxide of cerium | Hydroxide of cerium | Hydroxide of cerium | Hydroxide of cerium |
|  | Content (mass %) | 0.05 | 0.05 | 0.05 | 0.05 | 0.05 | 0.05 |
| Composition | First additive | — | — | PEG#600 | PVA-403 | PVA-403 | PVA-403 |
|  | Content (mass %) | — | — | 0.5 | 0.5 | 0.5 | 1 |
|  | Second additive | — | PAA-01 | — | — | PAA-01 | PAA-08 |
|  | Content (mass %) | — | 0.001 | — | — | 0.0001 | 0.0008 |
|  | Third additive | — | — | — | — | — | — |
|  | Content (mass %) | — | — | — | — | — | — |
|  | pH | 5.9 | 6.0 | 6.2 | 5.8 | 5.9 | 6.0 |
| Polishing rate | $SiO_2RR$ (nm/min) | 163 | 48 | 94 | 180 | 192 | 182 |
|  | p-SiRR (nm/min) | 62 | 90 | 4 | 12 | 1 | 0.8 |
|  | Polishing rate ratio | 3 | 1> | 24 | 15 | 192 | 228 |
| Flatness | Dishing progression rate (nm/min) | — | — | 66 | 106 | $SiO_2$ at convexities, unremovable | 75 |
| Polishing scratches (per wafer) |  | 0 | 2 | 3 | 1 | 0 | 0 |

TABLE 4

|  |  | Comparative Example 7 | Comparative Example 8 | Comparative Example 9 | Comparative Example 10 | Comparative Example 11 |
|---|---|---|---|---|---|---|
| Abrasive grains | Kind | Hydroxide of cerium | Hydroxide of cerium | Hydroxide of cerium | Hydroxide of cerium | Hydroxide of cerium |
|  | Content (mass %) | 0.05 | 0.05 | 0.05 | 0.05 | 0.05 |

TABLE 4-continued

|  |  | Comparative Example 7 | Comparative Example 8 | Comparative Example 9 | Comparative Example 10 | Comparative Example 11 |
|---|---|---|---|---|---|---|
| Composition | First additive | PEG#600 | PVA-403 | — | PEG#600 | — |
|  | Content (mass %) | 0.007 | 0.5 | — | 0.5 | — |
|  | Second additive | DAICHITOSAN 100D | N,N-dimethyl aminopropyl acrylamide polymer | — | — | PAA-01 |
|  | Content (mass %) | 0.015 | 0.001 | — | — | 0.001 |
|  | Third additive | — | — | Sulfanilic acid | Sulfanilic acid | Sulfanilic acid |
|  | Content (mass %) | — | — | 0.005 | 0.005 | 0.005 |
|  | pH | 6.4 | 6.1 | 6.1 | 6.1 | 6.2 |
| Polishing rate | SiO$_2$RR (nm/min) | 376 | 170 | 182 | 96 | 49 |
|  | p-SiRR (nm/min) | 13 | 6 | 60 | 5 | 82 |
|  | Polishing rate ratio | 29 | 28 | 3 | 19 | 1> |
| Flatness | Dishing progression rate (nm/min) | 122 | 118 | — | 55 | — |
| Polishing scratches (per wafer) |  | 0 | 2 | 0 | 0 | 2 |

Hereinafter, the results shown in Tables 1 to 4 will be described in detail.

In all of Examples 1 to 12, SiO$_2$RR was 200 nm/min or more, p-SiRR was 1 nm/min or less, and the polishing rate ratio was 150 or more, indicating a practicable sufficiently high polishing rate and a high polishing rate ratio. In the evaluation of pattern wafer, the dishing progression rate is 8 nm/min or less, and the obtained result was suppressed progression of dishing.

INDUSTRIAL APPLICABILITY

According to the present invention, it is possible to provide a polishing agent, a polishing agent set and a method for polishing a base, which can provide excellent polishing selectivity for insulating material with respect to stopper material and achieve a high degree of flattening of the surface of a base after polishing, in a CMP technique for polishing an insulating material (STI insulating material, pre-metal insulating material, interlayer insulating material or the like) using a stopper.

REFERENCE SIGNS LIST

1: silicon substrate, 2: polysilicon film, 3: silicon oxide film, AR: angle rotor, A1: rotation axis, A2: tube angle, R$_{min}$: minimum radius, R$_{max}$: maximum radius, R$_{av}$: average radius

The invention claimed is:

1. A method for polishing a base comprising an insulating material and a stopper material, comprising a step of polishing a surface to be polished of a base using a polishing agent comprising:
a fluid medium;
abrasive grains containing a hydroxide of a tetravalent metal element;
a first additive;
a second additive; and
a third additive,
wherein:
the first additive is at least one selected from the group consisting of a compound having a polyoxyalkylene chain and a vinyl alcohol polymer;
the second additive is a cationic polymer;
the third additive is an amino group-containing sulfonic acid compound;
the insulating material contains silicon dioxide; and
the stopper material contains polysilicon.

2. A method for polishing a base comprising an insulating material and a stopper material, the method comprising a step of polishing a surface to be polished of the base using a polishing agent comprising:
a fluid medium;
abrasive grains containing a hydroxide of a tetravalent metal element;
a first additive;
a second additive; and
a third additive,
wherein:
the first additive is at least one selected from the group consisting of a compound having a polyoxyalkylene chain and a vinyl alcohol polymer;
the second additive is a cationic polymer; and
the third additive is an amino group-containing sulfonic acid compound;
wherein the insulating material contains silicon dioxide and the stopper material contains polysilicon; and
wherein the polishing agent is obtained from a polishing agent set comprising constituent components of the polishing agent stored as separate liquids containing a first liquid and a second liquid, wherein the first liquid contains the abrasive grains, and the second liquid contains at least one selected from the group consisting of the first additive, the second additive and the third additive, and the polishing agent is obtained by mixing at least the first liquid and the second liquid.

3. A method for polishing a base comprising an insulating material and a stopper material,
the method comprising a step of selectively polishing the insulating material with respect to the stopper material using a polishing agent comprising:
a fluid medium;
abrasive grains containing a hydroxide of a tetravalent metal element;
a first additive;
a second additive; and
a third additive,
wherein:
the first additive is at least one selected from the group consisting of a compound having a polyoxyalkylene chain and a vinyl alcohol polymer;
the second additive is a cationic polymer;

the third additive is an amino group-containing sulfonic acid compound;

the insulating material contains silicon dioxide; and the stopper material contains polysilicon.

4. A method for polishing a base comprising an insulating material and a stopper material, the method comprising a step of selectively polishing the insulating material with respect to the stopper material using a polishing agent comprising:

a fluid medium;

abrasive grains containing a hydroxide of a tetravalent metal element;

a first additive;

a second additive; and a third additive, wherein:

the first additive is at least one selected from the group consisting of a compound having a polyoxyalkylene chain and a vinyl alcohol polymer;

the second additive is a cationic polymer; and the third additive is an amino group-containing sulfonic acid compound;

wherein the insulating material contains silicon dioxide and the stopper material contains polysilicon; and wherein the polishing agent is obtained from a polishing agent set comprising constituent components of the polishing agent stored as separate liquids containing a first liquid and a second liquid, wherein the first liquid contains the abrasive grains, and the second liquid contains at least one selected from the group consisting of the first additive, the second additive and the third additive, and the polishing agent is obtained by mixing the first liquid and the second liquid.

5. The method according to claim 3, wherein the second additive is at least one selected from the group consisting of an allylamine polymer, a diallylamine polymer, a vinylamine polymer and an ethyleneimine polymer.

6. The method according to claim 3, wherein the third additive is at least one selected from the group consisting of sulfamic acid, an aliphatic aminosulfonic acid, an aromatic aminosulfonic acid and their salts.

7. The method according to claim 3, wherein a content of the third additive is 0.0005 mass % or more and 0.2 mass % or less based on a total mass of the polishing agent.

8. The method according to claim 3, wherein the hydroxide of a tetravalent metal element contains at least one hydroxide ion and at least one anion other that a hydroxide ion bonded to the tetravalent metal element.

* * * * *